(12) United States Patent
Jeong et al.

(10) Patent No.: US 7,473,954 B2
(45) Date of Patent: Jan. 6, 2009

(54) BITLINE OF SEMICONDUCTOR DEVICE HAVING STUD TYPE CAPPING LAYER AND METHOD FOR FABRICATING THE SAME

(75) Inventors: Mun-Mo Jeong, Seoul (KR); Chang-Huhn Lee, Gyeonggi-do (KR); Makoto Yoshida, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 225 days.

(21) Appl. No.: 11/249,097

(22) Filed: Oct. 11, 2005

(65) Prior Publication Data

US 2006/0027852 A1 Feb. 9, 2006

Related U.S. Application Data

(62) Division of application No. 10/636,131, filed on Aug. 6, 2003, now Pat. No. 6,982,199.

(30) Foreign Application Priority Data

Aug. 23, 2002 (KR) ................. 2002-50246

(51) Int. Cl.
*H01L 29/94* (2006.01)
(52) U.S. Cl. .............................. 257/306
(58) Field of Classification Search ........ 257/68–71, 257/296–309, 905–908, E27.084–E27.097, 257/E27.075, 314–326, E27.078, E29.3–E29.309, 257/225–234, 390, E27.076, E27.098–E27.101, 257/E27.077
See application file for complete search history.

(56) References Cited

U.S. PATENT DOCUMENTS 6,042,999 A    3/2000   Lin et al.
6,080,620 A    6/2000   Jeng
6,255,160 B1   7/2001   Huang
6,281,073 B1 * 8/2001   Lee ........................ 438/255

(Continued)

FOREIGN PATENT DOCUMENTS

CN           1230778       10/1999

(Continued)

OTHER PUBLICATIONS

English language abstract of Korea Publication No. 2001-0055685.

*Primary Examiner*—M. Wilczewski
*Assistant Examiner*—Swapneel Chhaya
(74) *Attorney, Agent, or Firm*—Marger Johnson & McCollom, P.C.

(57) ABSTRACT

A semiconductor device with a bitline structure has a stud type capping layer. A method of fabricating the same achieves sufficient process margins and reduces parasitic capacitance.

The device may include an insulating film formed on a semiconductor substrate and having a bitline contact and a groove-shaped bitline pattern, a bitline formed on the bitline contact and on a portion of the bitline pattern and that is surrounded by the insulating film, and a bitline capping layer formed on the bitline within the bitline pattern and the insulating film that protrudes from the insulating film. A protruded portion of the bitline capping layer is wider than a width of the bitline.

7 Claims, 26 Drawing Sheets

U.S. PATENT DOCUMENTS

| | | |
|---|---|---|
| 6,344,389 B1 * | 2/2002 | Bronner et al. ............. 438/244 |
| 6,350,707 B1 | 2/2002 | Liu et al. |
| 6,372,575 B1 | 4/2002 | Lee et al. |
| 2001/0045666 A1 | 11/2001 | Kim et al. |
| 2002/0115256 A1 | 8/2002 | Lee et al. |
| 2003/0235948 A1 | 12/2003 | Park |

FOREIGN PATENT DOCUMENTS

| | | |
|---|---|---|
| JP | 10-27889 | 1/1998 |
| KR | 2001-0055685 | 7/2001 |
| WO | WO 01/43176 | 6/2001 |

* cited by examiner

BITLINE OF SEMICONDUCTOR DEVICE HAVING STUD TYPE CAPPING LAYER AND METHOD FOR FABRICATING THE SAME

CROSS REFERENCE TO RELATED APPLICATIONS

This application is a Divisional of U.S. patent Ser. No. 10/636,131, filed on Aug. 6, 2003, now issued as U.S. Pat. No. 6,982,199, which claims priority from Korean Patent Application No. 2002-50246, filed on Aug. 23, 2002, the contents of which are incorporated herein by reference in their entirety.

BACKGROUND OF THE INVENTION

1. Technical Field of the Invention

This disclosure generally relates to a bitline structure of a semiconductor device, and more specifically, to a damascene bitline structure of a semiconductor device and a method for fabricating the same that reduces parasitic capacitance and that improves process margins by forming a stud type capping layer.

2. Description of the Related Art

As the size of semiconductor devices is reduced, the line width of bitlines and data lines is also decreased, thereby increasing the bitline resistance. To solve this problem, a metal film like tungsten is often used for bitline materials, instead of a metal silicide such as tungsten silicide (WSix).

FIG. 1 is a diagram illustrating a semiconductor device of the prior art that has a COB (Capacitor Over Bitline) structure. FIGS. 2A-2D and FIGS. 3A-3D are cross-sectional diagrams illustrating fabrication methods for a conventional semiconductor device, wherein FIGS. 2A-2D are cross-sectional views taken along a line IA-IA' of FIG. 1, and FIGS. 3A-3D are cross-sectional views taken along a line IB-IB' of FIG. 1. FIG. 4 is a cross-sectional diagram of the conventional semiconductor device, taken along a line IC-IC' of FIG. 1.

Referring to FIG. 2A and FIG. 3A, a semiconductor substrate 100 including active regions 101 and field regions is provided. Through a conventional STI (Shallow Trench Isolation) process, STI isolation films 105 are formed in the field regions of the semiconductor substrate 100.

Referring to FIG. 3A, gates 110 are formed on the semiconductor substrate 100, each including a gate insulating film 111, a gate electrode material 113, and a capping layer 115 in stack and a spacer 117 formed on a sidewall.

Referring to FIGS. 2A and 3A, after forming a first inter-insulation layer 120 on the entire surface of the substrate including the gates 110, contacts 125 exposing portions of the active regions 101, for instance, SACs (Self-Aligned Contacts) are formed. And, contact pads 130 comprised of a poly-silicon film and others are formed on the contacts 125. At this time, though not shown in the drawings, the contact pads 130 are electrically connected to impurity regions of a predetermined conductivity type formed in the active regions 101.

Then, after depositing a second inter-insulation layer 140 on the first inter-insulation layer 120, bitline contact holes 145 are formed to expose corresponding ones of the contact pads 130, that is, the corresponding contact pads that are to be connected with bitlines in a subsequent process.

After depositing a metal film for a contact pad, for example, a tungsten film on the entire surface of the substrate including the bitline contact holes 145, the tungsten film is etched by a chemical-mechanical polishing process (CMP) or an etch back process, thereby forming bitline contact pads 150 in the bitline contact holes 145.

Referring to FIG. 2B and FIG. 3B, a conductive material 161 for a bitline, such as a tungsten film, and the bitline capping layer 165, such as a silicon nitride film, are sequentially deposited on the second inter-insulation layer 140 and patterned to form bitlines 160. Each bitline includes the stacked conductive material 161 and the capping layer 165. The bitline 160 is electrically connected to the bitline contact pad 150 formed in the bitline contact holes 145. An insulating film, such as a silicon nitride film, for a bitline spacer is deposited on the second inter-insulation layer 140 including the bitlines 160 and etched to form bitline spacers 170.

Referring to FIG. 2C and FIG. 3C, a third inter-insulation layer 180 is formed on a second inter-insulation layer 140 including the bitlines 160. By etching the second and the third inter-insulation layers 140 and 180, storage node contact holes 185 are formed to expose corresponding contact pads of the contact pads 130, that is, the corresponding contact pads connected to the storage node contact pads to be formed in a subsequent process.

After depositing a poly-silicon film on the third inter-insulation layer 180 to fill the storage node contacts 185, storage node contact pads 190 are formed through a CMP method and others. The storage node contact pad 190 is electrically connected to the contact pad 130 through the storage node contact holes 185. Then, storage nodes 200 of capacitors connected to the storage node contact pads 190 are formed.

The prior art method forms bitlines by etching a metal film like a tungsten film through a photoetching process, thus there may be restrictions on an etching of a metal pattern having a small line/spacer due to high integration as well as increased process complexity.

In addition, since cleaning solutions that include OH radicals such as SC1 (Standard Cleaning 1), with excellent detergency for particles and polymers, can not be used while patterning a metal film for forming bitlines, it is impossible to perfectly remove particles during the cleaning process, thereby causing defects.

To solve the above problems of the prior art, a method of forming bitlines through a damascene process has been suggested. When forming bitlines of a semiconductor device having a COB structure with a damascene process, it is necessary to surround the bitlines by forming materials having etching selectivity with an inter-insulation layer of an oxide film, for instance, a capping layer and a spacer comprised of a silicon nitride film on tops and side walls of the bitlines, in order to protect the bitlines during the next process of forming a storage node contact hole.

A technology of protecting the bitlines by perfectly surrounding a damascene bitline with the capping layer and the spacer has been suggested in Korean Patent Laid Open Report No. 2001-55685. The above technology forms a bitline that is perfectly surrounded by a spacer comprised of a silicon nitride film, thereby obtaining process margins by protecting the bitlines during the storage node contact hole process. However, it causes the increase of parasitic capacitance since a silicon nitride film between neighboring bitlines has a higher dielectric constant than an oxide film.

Embodiments of the invention address these and other disadvantages of the prior art.

SUMMARY OF THE INVENTION

Embodiments of the invention provide a semiconductor device and a fabrication method thereof for improving process margins while forming a storage node contact hole by forming a stud type bitline capping layer.

Embodiments of the invention also provide a semiconductor device and a fabricating method thereof for reducing parasitic capacitance between bitlines and between a bitline and a storage node contact hole by surrounding the bitline with an oxide film.

BRIEF DESCRIPTION OF THE DRAWINGS

The above and other objects and advantages of the invention will become readily apparent from the description that follows, with reference to the accompanying drawings.

DETAILED DESCRIPTION OF THE INVENTION

Figure 1:
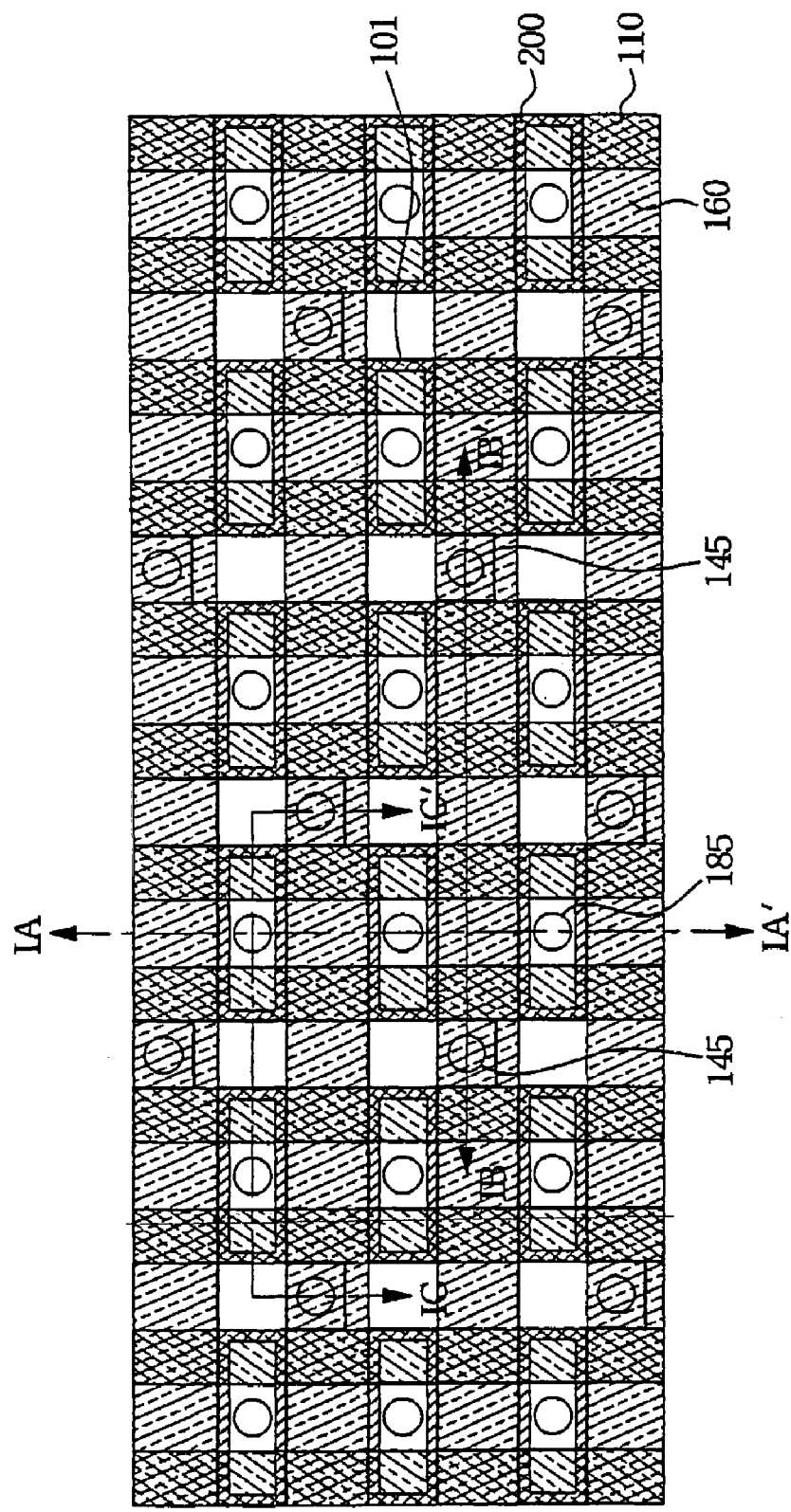
FIG. 1 is a plan diagram illustrating a prior art semiconductor device having a COB structure.
Figure 2A:
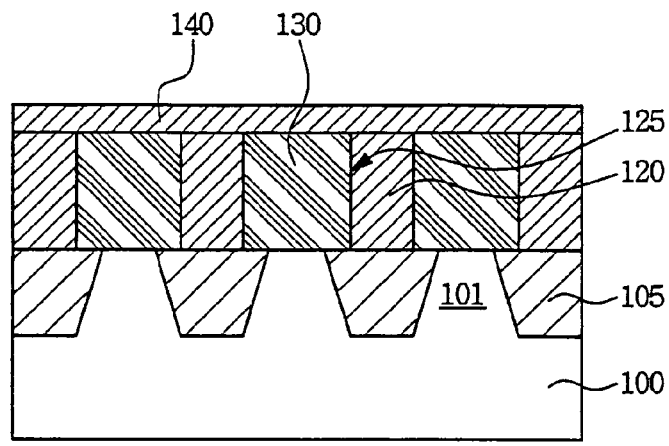
FIGS. 2A-2D are cross-sectional diagrams illustrating a fabrication method of a prior art semiconductor device, taken along a line IA-IA' of FIG. 1.
Figure 2B:
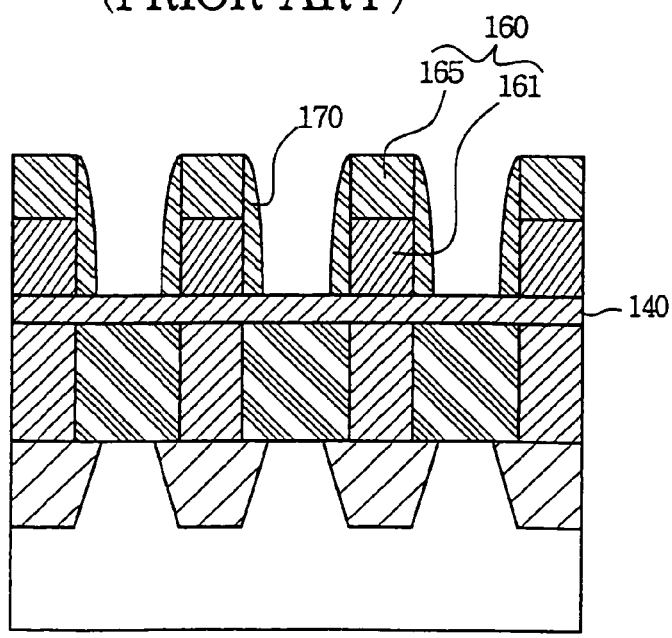
Figure 2C:
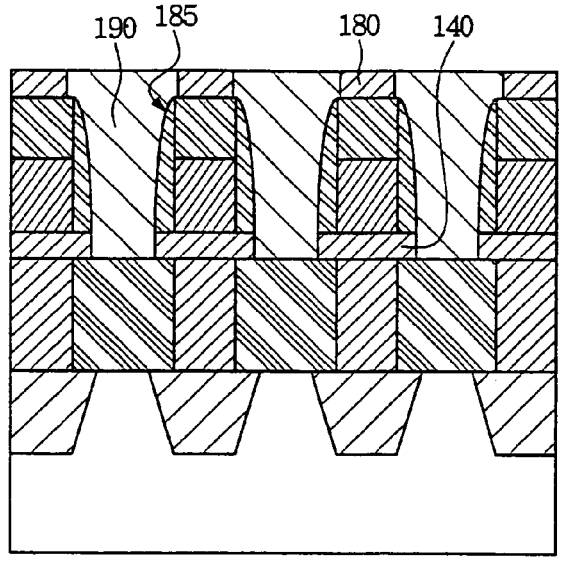
Figure 2D:
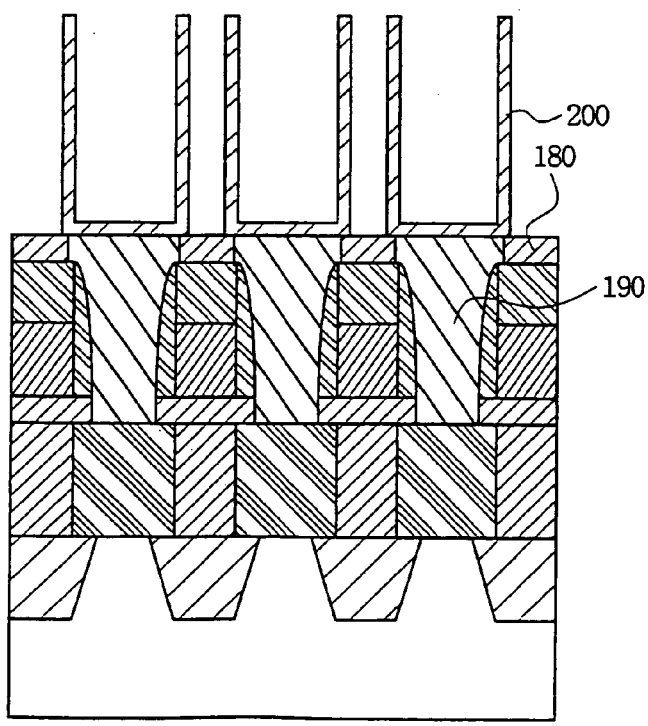
Figure 3A:
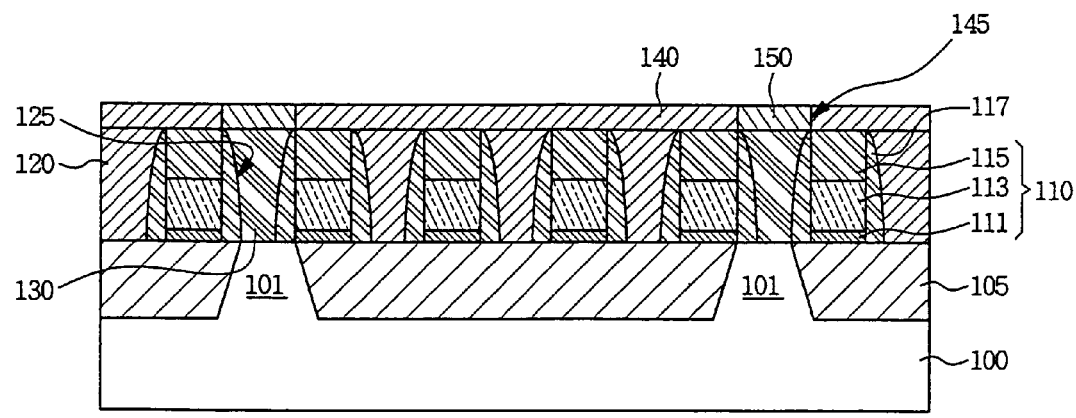
FIGS. 3A-3D are cross-sectional diagrams illustrating a fabrication method of a prior art semiconductor device, taken along a line IB-IB' of FIG. 1.
Figure 3B:
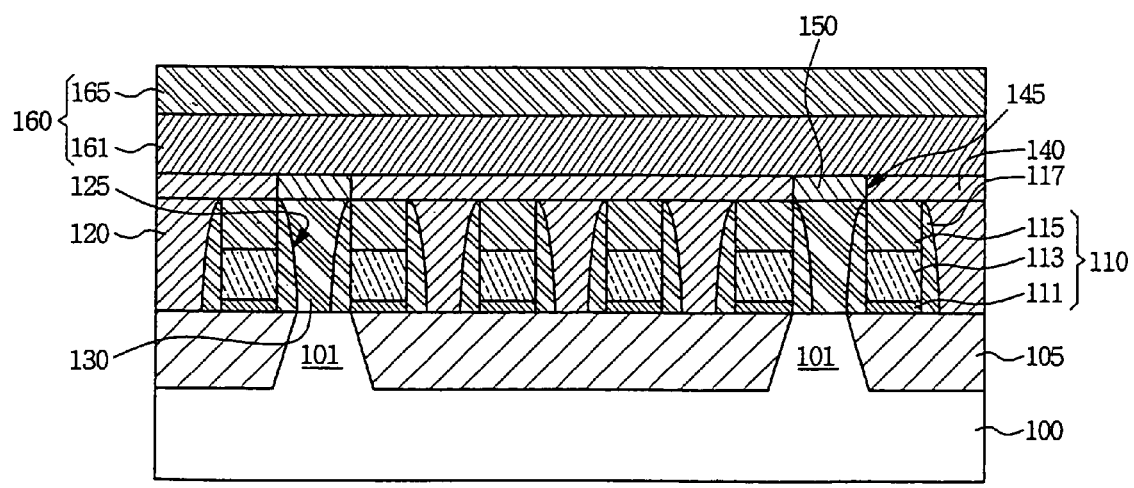
Figure 3C:
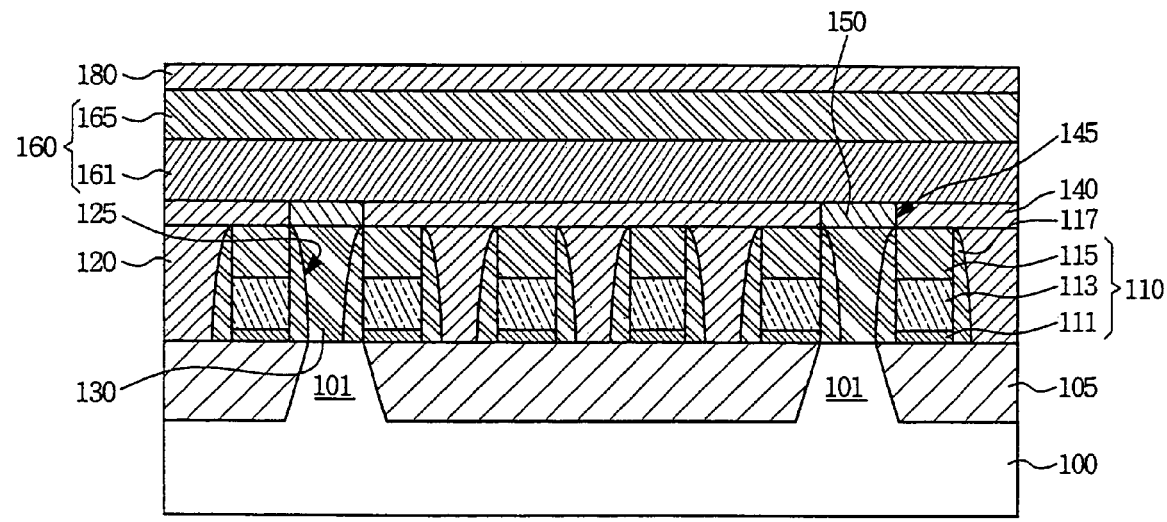
Figure 3D:
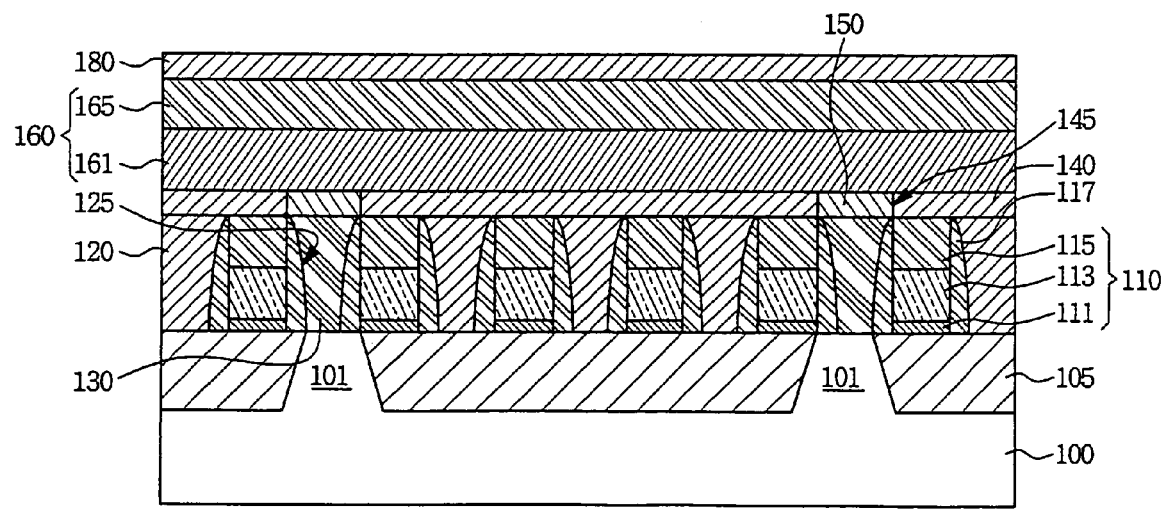
Figure 4:
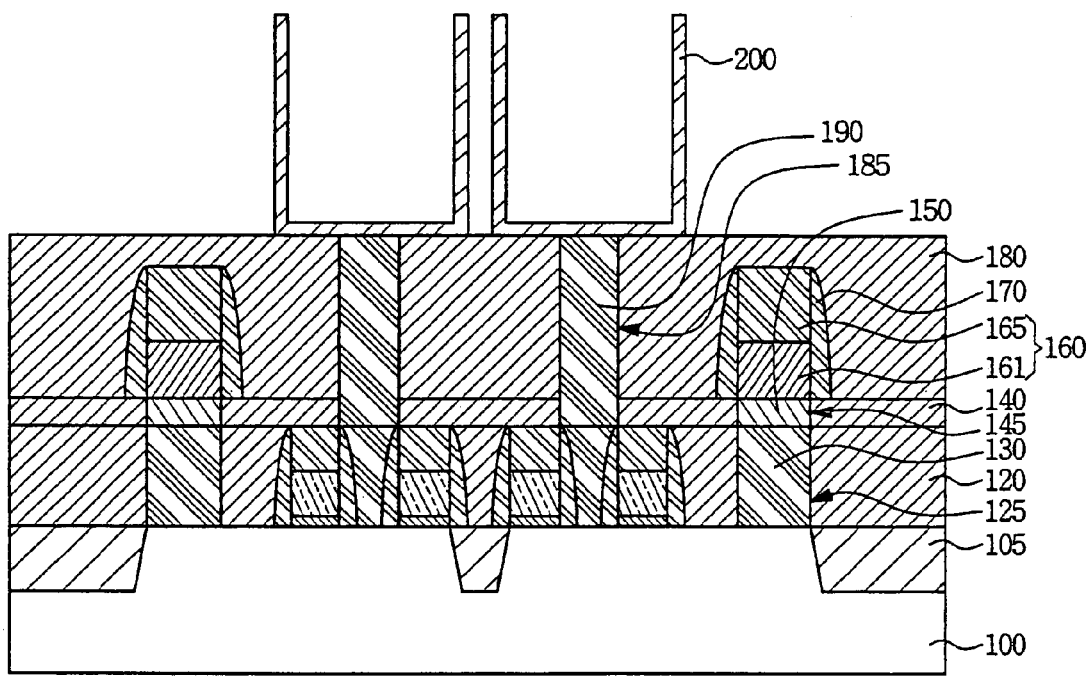
FIG. 4 is a cross-sectional diagram of a prior art semiconductor device, taken along a line IC-IC' of FIG. 1.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervention layers may be also be present. Moreover, each embodiment described and illustrated herein contemplates and includes its complementary conductivity type embodiment as well.

FIG. 5A-5I are cross-sectional diagrams corresponding to a line IA-IA' of FIG. 1, illustrating a fabrication method of a semiconductor device having a COB structure in accordance with an embodiment of the invention. FIG. 6A-6I are cross-sectional diagrams illustrating a fabrication method of a semiconductor device in accordance with an embodiment of the invention, corresponding to a line IB-IB' line of FIG. 1. FIG. 7A-7I are process cross-sectional diagrams illustrating a fabrication method of a semiconductor device in accordance with an embodiment of the invention, corresponding to a line IC-IC' of FIG. 1.

Figure 5A:
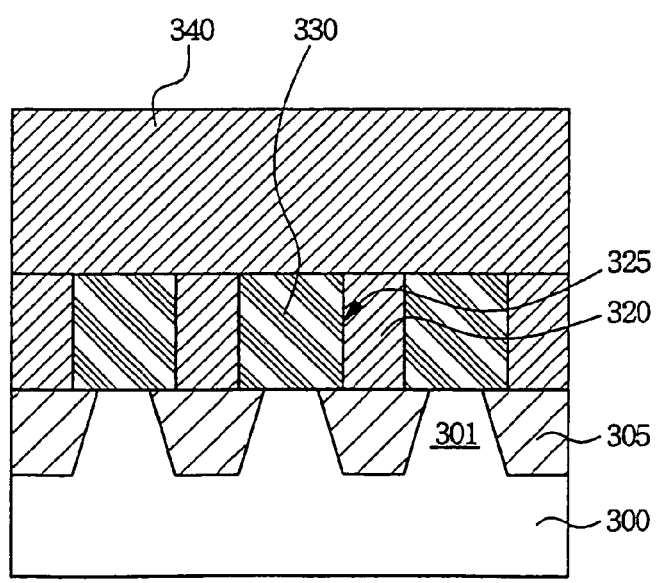
FIG. 5A-5I are process cross-sectional diagrams illustrating a fabrication method of a semiconductor device in accordance with an embodiment of the invention.
Figure 6A:
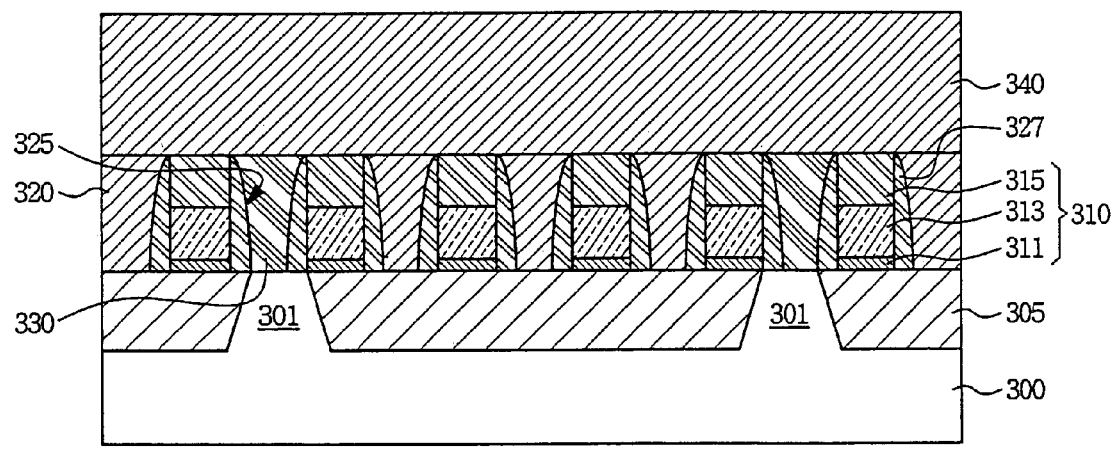
FIG. 6A-6I are process cross-sectional diagrams illustrating a fabrication method of a semiconductor device in accordance with an embodiment of the invention.
Figure 7A:
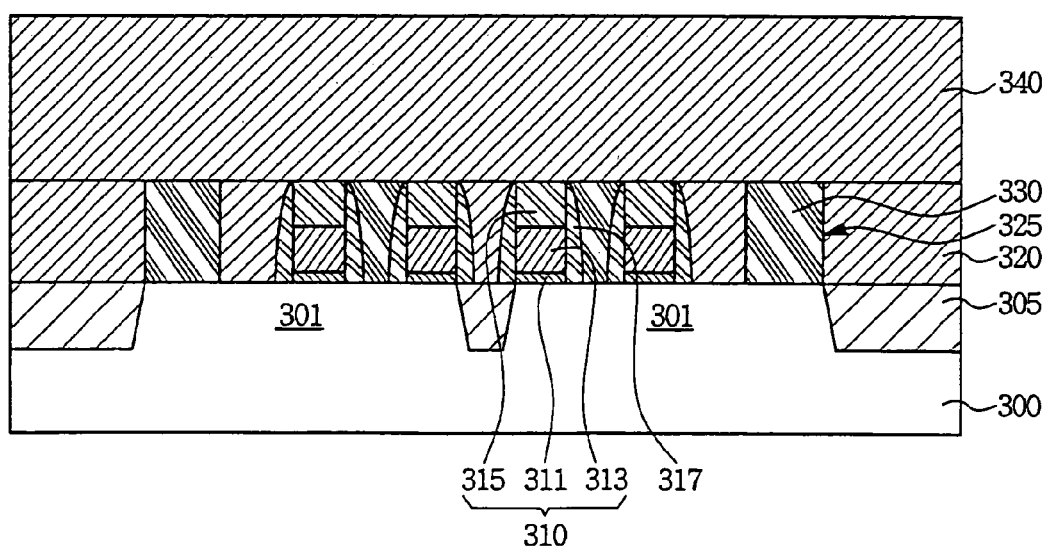
FIG. 7A-7I are process cross-sectional diagrams illustrating a fabrication method of a semiconductor device in accordance with an embodiment of the invention.

Referring to FIG. 5A, FIG. 6A, and FIG. 7A, a semiconductor substrate 300 having active regions 301 and field regions is provided. STI isolation films 305 are formed in the field regions of the semiconductor substrate 300 through a conventional STI (Shallow Trench Isolation) process.

After depositing a first inter-insulation layer 320 on the entire surface of the substrate including gates 310, contacts 325 exposing portions of the active region 301 between the gates 310, for instance, SACs (Self-Aligned Contacts) are formed. And, contact pads 330 including conductive materials like poly-silicon films are formed on the contacts 325. At this time, though not shown in the drawings, the contact pads 330 are electrically connected to impurity regions having a predetermined conductivity type formed in the active region 301.

Then, after depositing a second inter-insulation layer 340 on the first inter-insulation layer 320, the second inter-insulation layer 340 is smoothed by performing a CMP or an etch back process. At this time, a second inter-insulation layer 340 is formed to a thickness of about 4500 Å to 5000 Å. The second inter-insulation layer 340 includes an oxide film series such as HDP (High Density Plasma) oxide film, BPSG film, or others.

Figure 5B:
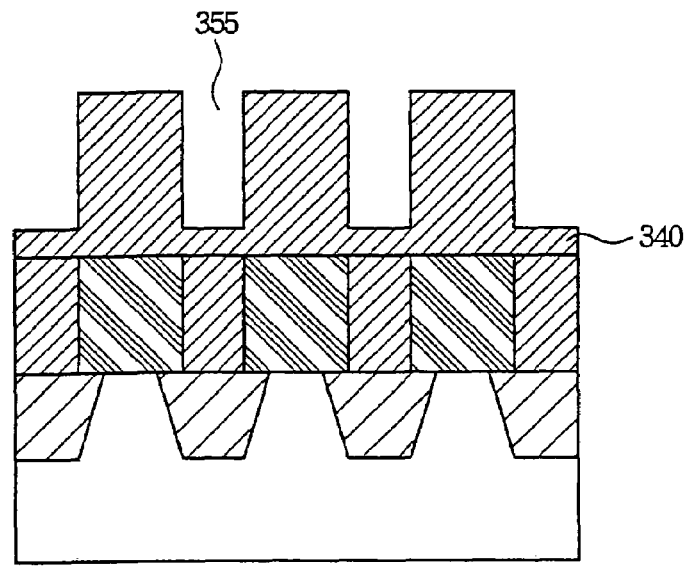
Figure 5C:
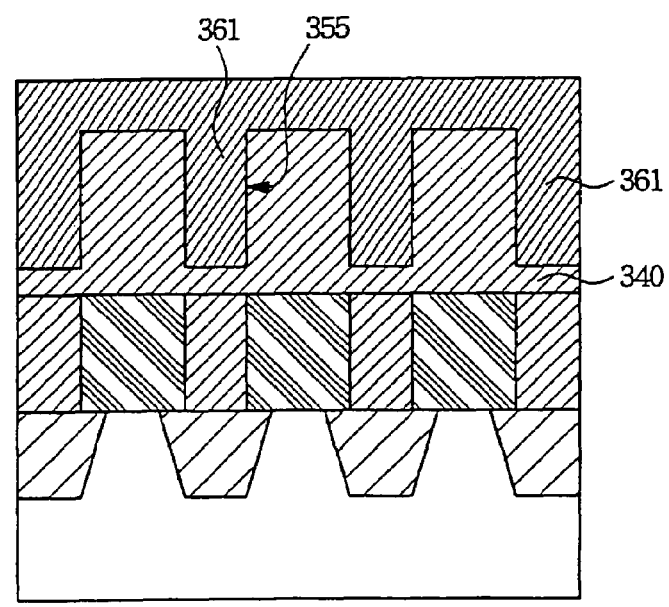
Figure 5D:
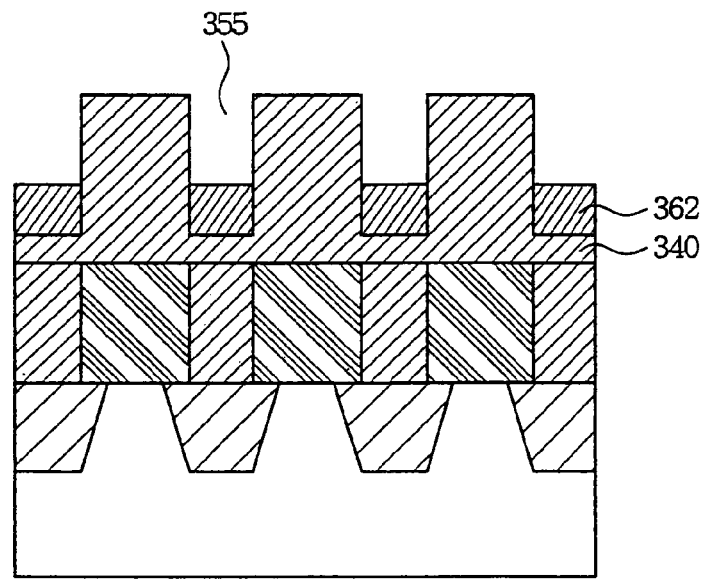
Figure 5E:
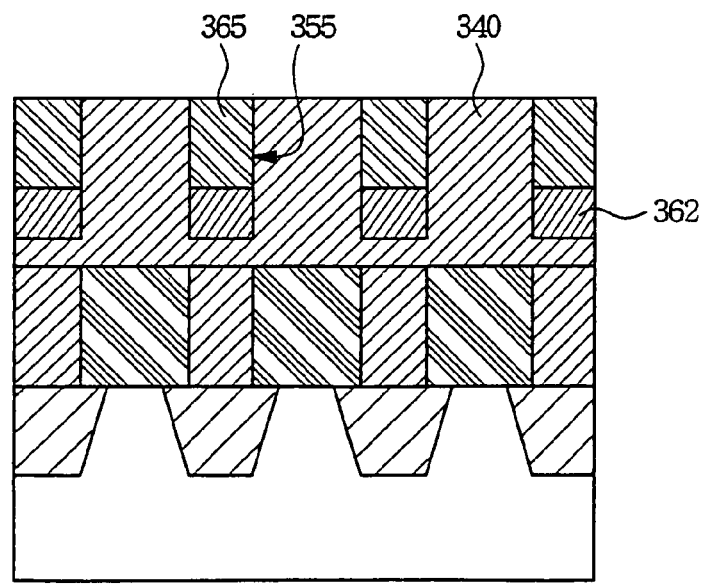
Figure 5F:
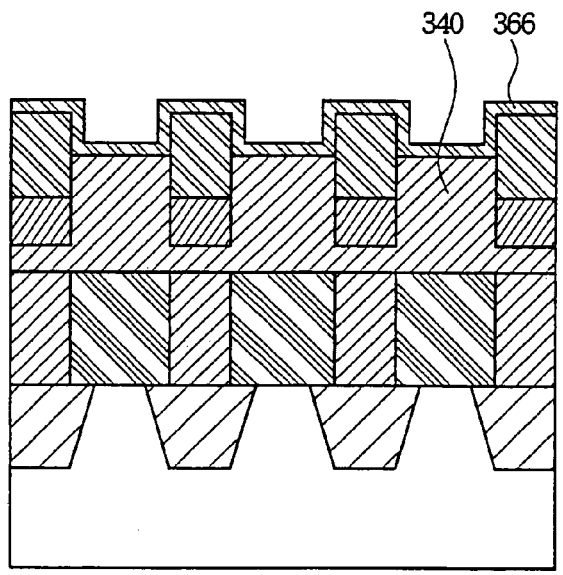
Figure 5G:
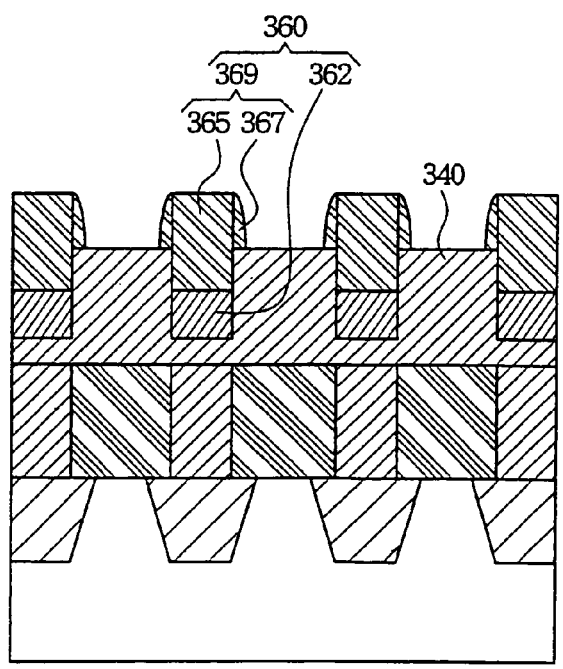
Figure 5H:
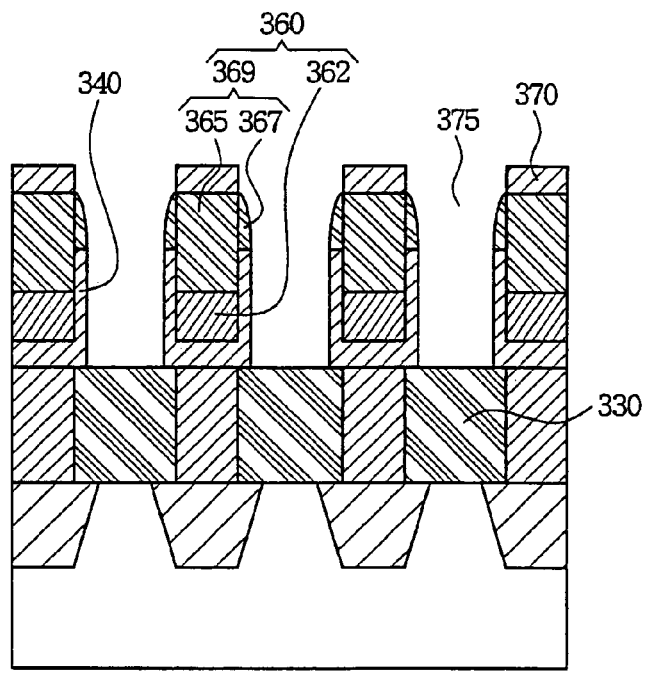
Figure 5I:
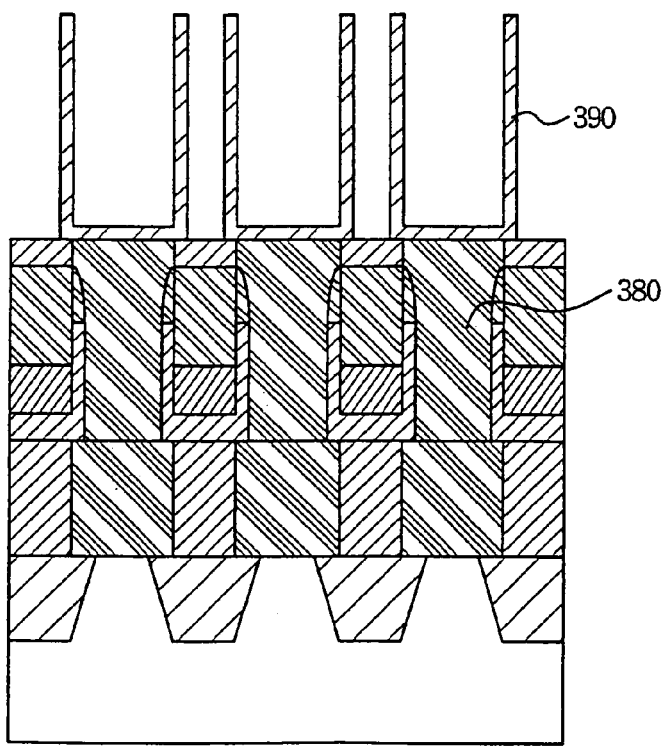
Figure 6B:
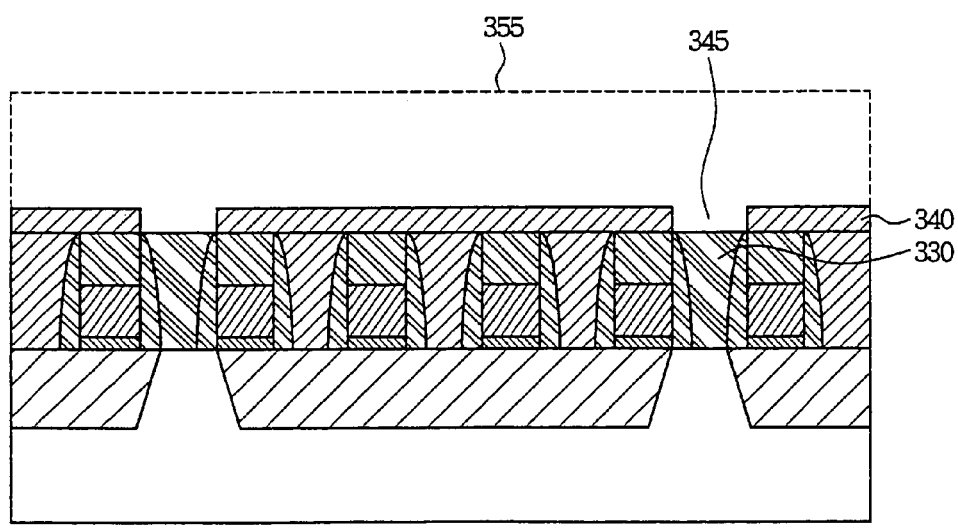
Figure 7B:
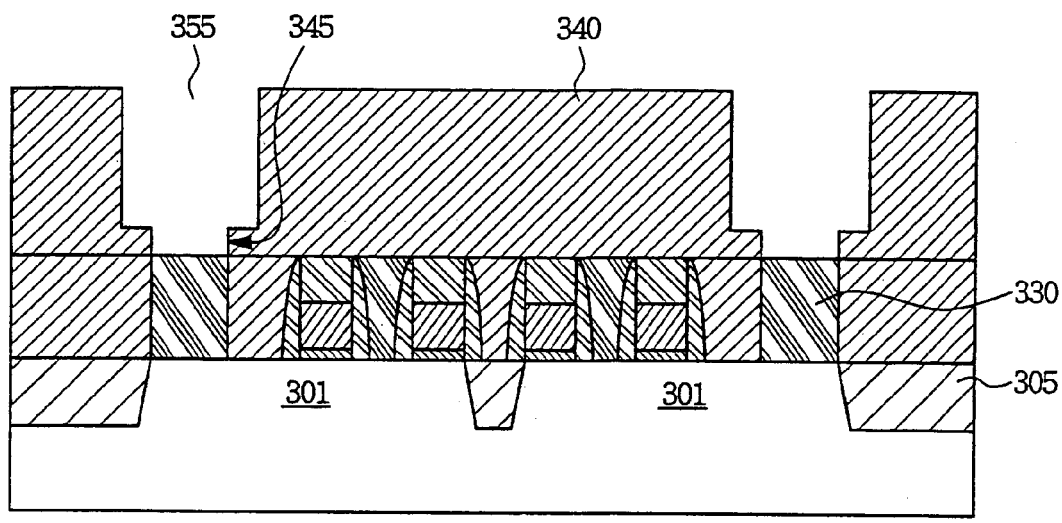

Referring to FIG. 5B, FIG. 6B, and FIG. 7B, bitline contact holes 345 (not illustrated in FIGS. 5B-5I) and bitline patterns 355 are formed by etching the second inter-insulation layer 340 through a dual damascene process. At this time, the bitline contact holes 345 are formed to expose corresponding contact pads of the contact pads 330, that is, the corresponding contact pads connected to bitlines that will be formed in a subsequent process. The bitline patterns 355 are formed to cross with the gates and have a grooved shape.

When forming the bitline contact holes 345 and the bitline patterns 355 by etching the second inter-insulation layer 340 through the dual damascene process, it is possible to form the bitline patterns 355 after forming the bitline contact holes 345 or form the bitline contact holes 345 after forming the bitline patterns 355. At this point, the bitline contact holes 345 are formed by etching the second inter-insulation layer 340, using the contact pads 330 as an etching stop film.

Figure 6C:
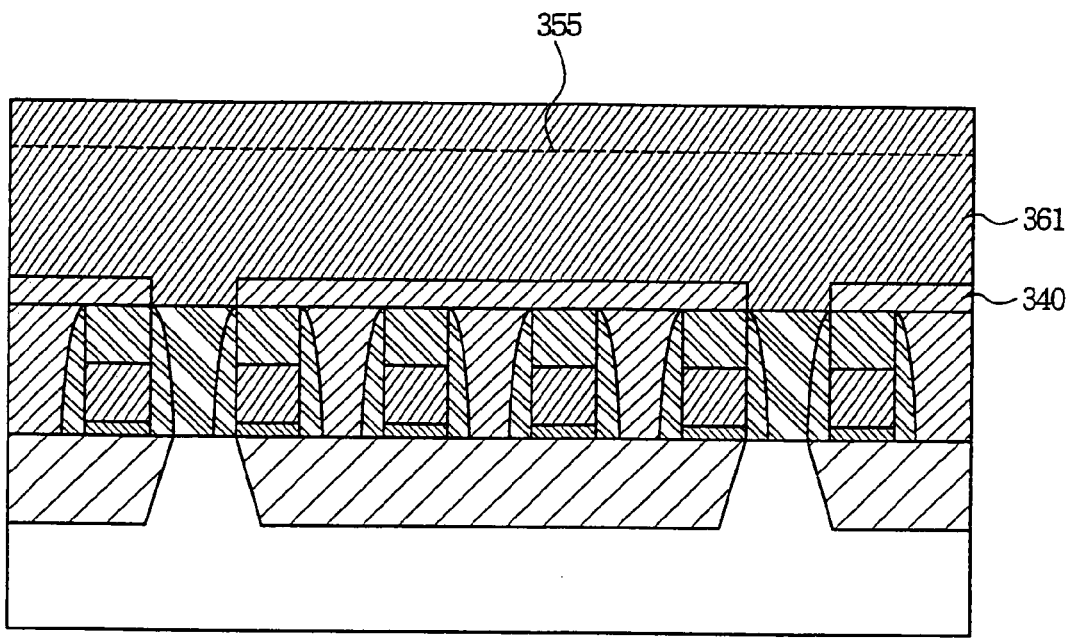
Figure 6D:
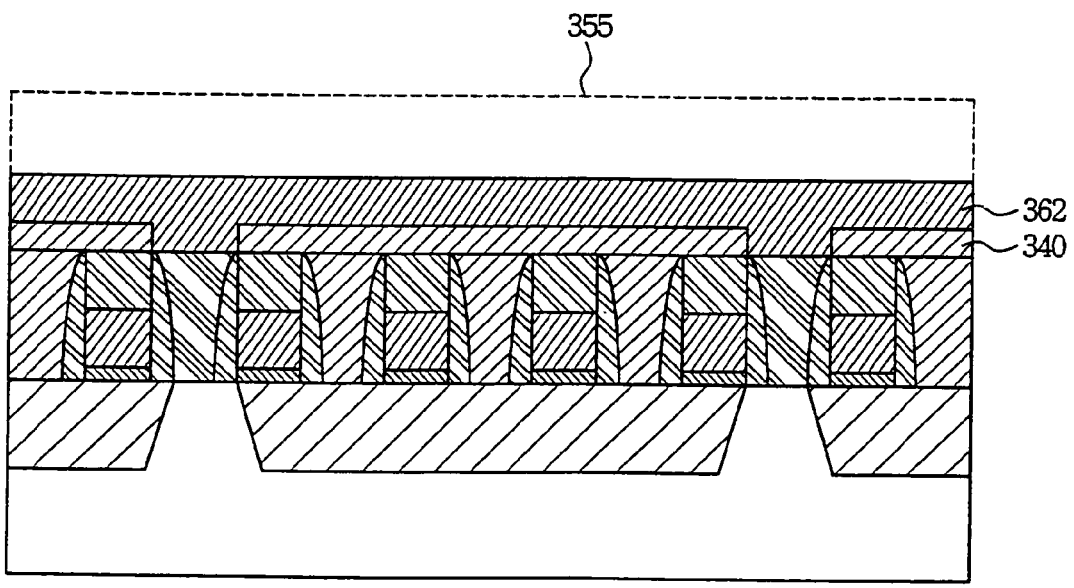
Figure 7C:
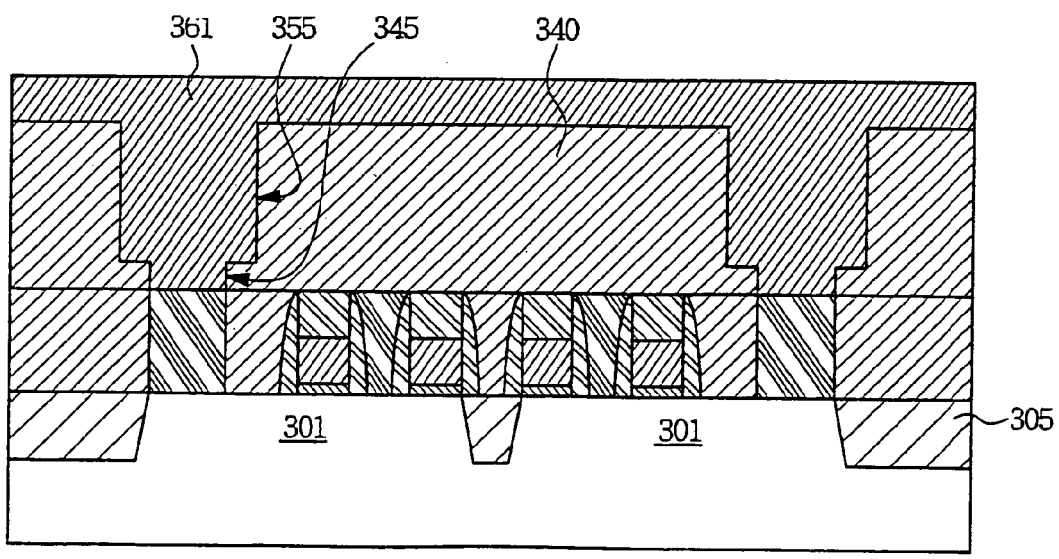
Figure 7D:
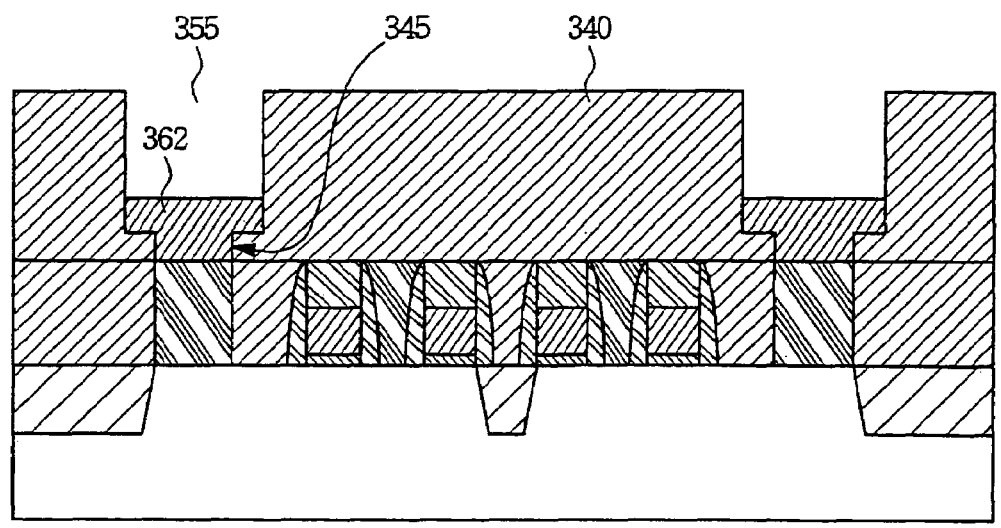

Referring to FIG. 5C, FIG. 6C and FIG. 7C, a conductive material 361 for a bitline, such as a tungsten film, is deposited on the second inter-insulation layer 340 including bitline contact holes 345 and bitline patterns 355. Referring to FIG. 5D, FIG. 6D and FIG. 7D, the conductive material 361 is over-etched to be left in the bitline contact holes 345 and a portion of the bitline patterns 355.

On this occasion, it is desirable that the bitline patterns 355 have approximately 2500 Å in depth and the conductive material 362 for a bitline remaining in the bitline patterns 355 has approximately 500 Å in thickness. The conductive material 361 for a bitline can be over-etched by using a CMP or an etch back process, or over-etched by using both a CMP process and the etch back process.

In an embodiment of the present invention, the bitline contact holes 345 are also filled when the bitline patterns 355 are filled with the conductive material 361 for a bitline, rather than filling the bitline patterns 355 with the conductive material 361 for a bitline after forming contact plugs in the bitline contact holes 345 through another process.

Figure 6E:
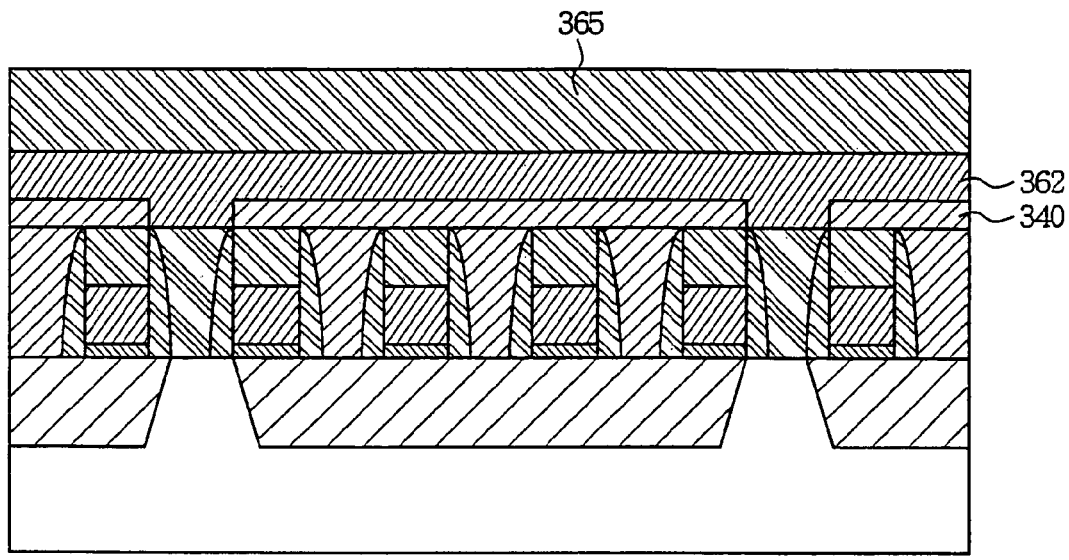
Figure 7E:
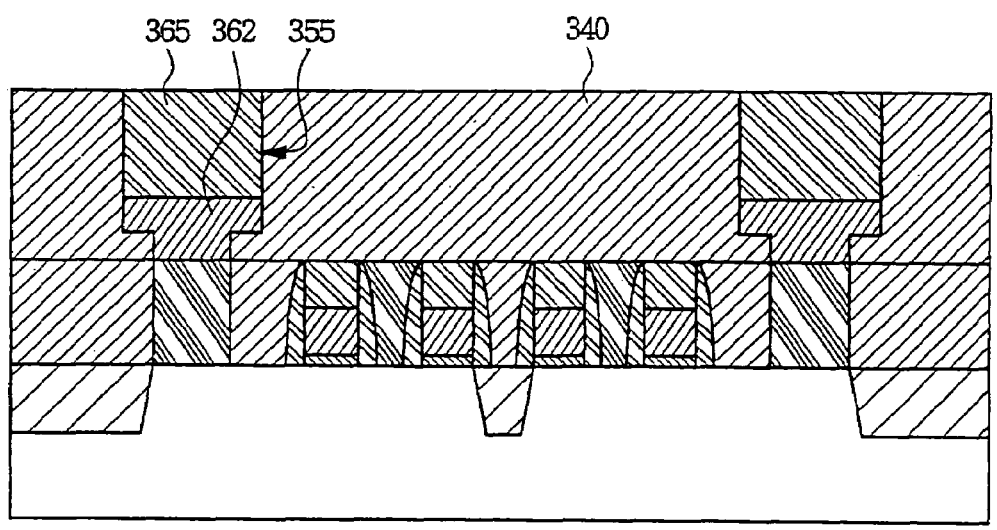

Referring to FIG. 5E, FIG. 6E, and FIG. 7E, a first capping material 365 is etched by a CMP or an etch back process to be filled within bitline patterns 355 on the bitline conductive material 362, after depositing the first capping material 365 for a bitline on the second inter-insulation layer 340 including the bitline patterns 355.

Figure 6F:
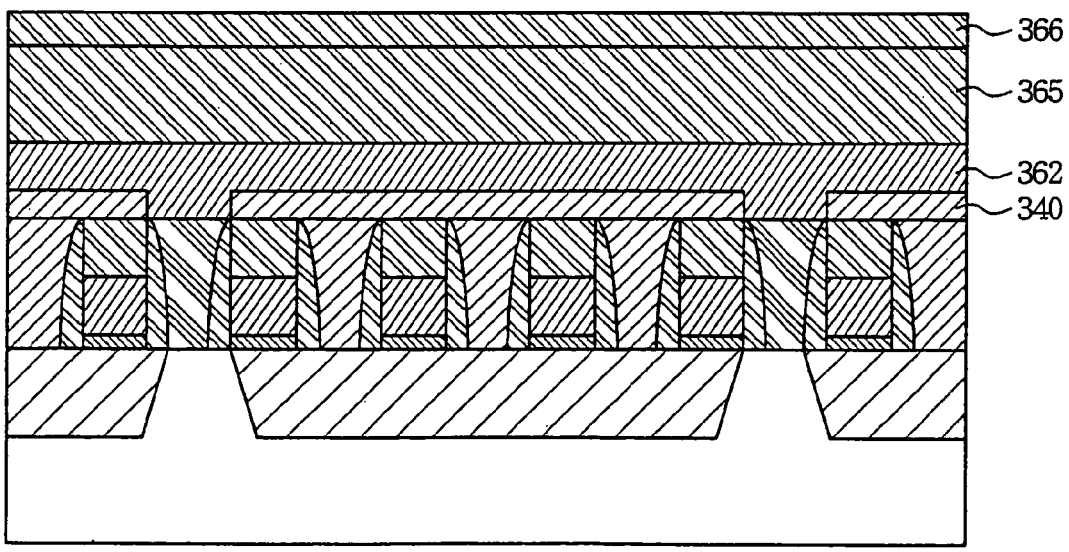
Figure 7F:
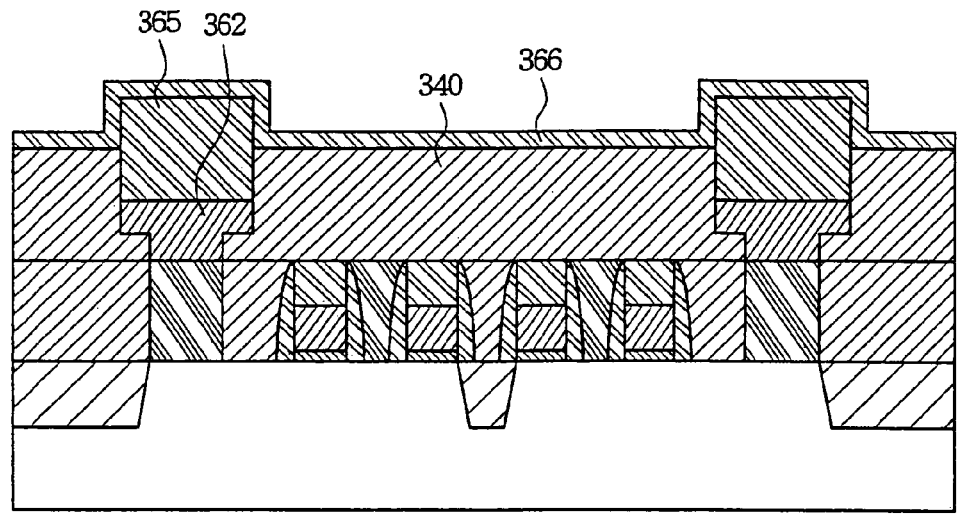

Referring to FIG. 5F, FIG. 6F, and FIG. 7F, after dry-etching or wet-etching the second inter-insulation layer 340 to protrude the first capping material 365 to a certain thickness, a second capping material 366 for a bitline is deposited on the entire surface of the substrate. At this moment, it is desirable to etch the second inter-insulation layer 340 to half the thickness of the first capping material 365 formed on the bitline conductive material 362 within the bitline pattern 355.

Therefore, supposing that the bitline patterns 355 has 2500 Å in depth and the conductive material 362 for a bitline has 500 Å in thickness, it is desirable to etch the second inter-insulation layer 340 to a thickness of 1000 Å. The first capping material 365 and the second capping material 366 include a material having wet and dry etching selectivity with respect to the second inter-insulation layer 340 of an oxide film series, for example, a silicon nitride film or others.

Figure 6G:
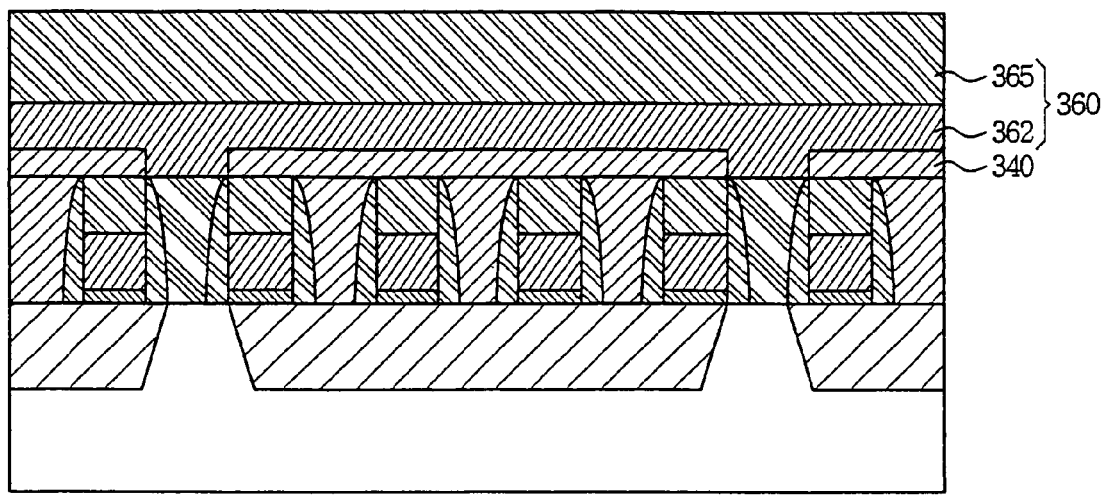
Figure 7G:
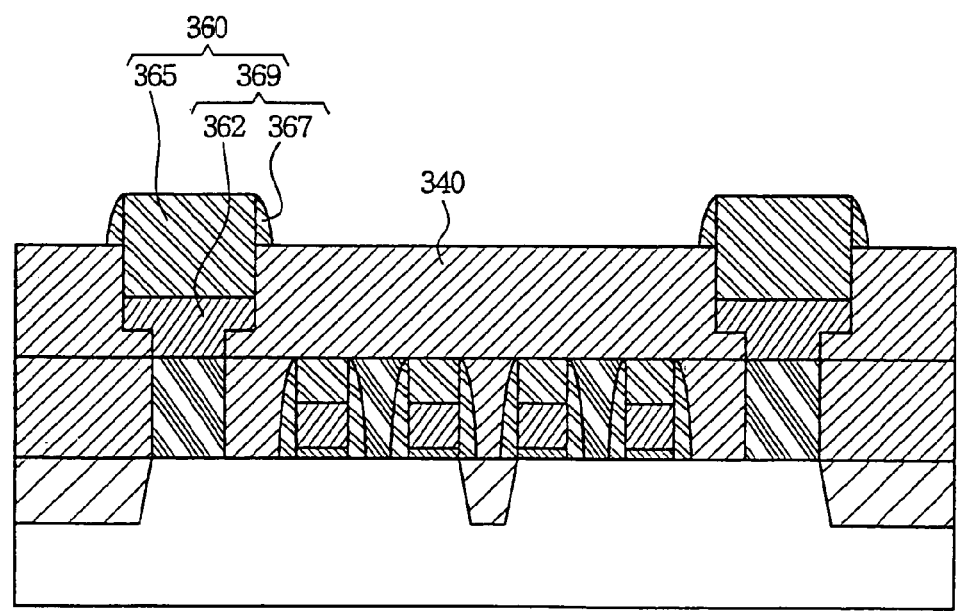

Referring to FIG. 5G, FIG. 6G, and FIG. 7G, the silicon nitride film of the second capping material 366 is etched back to remain only as a spacer type at a sidewall of a protruded part of the silicon nitride film of the first capping material 365. Thus, bit line capping layers 369 of a stud type are formed, each including the first capping material 365 with a pillar type formed on a conductive material 362 and the second capping material 367 with a spacer type formed on the sidewall of the protruded part of the first capping material 365.

At this time, a part of the bitline capping layer 369 that is surrounded by the second inter-insulation layer 340 has the same width as the bitline pattern 355 and the bitline 360, and the protruded part has a width larger than the bitline pattern 355 and the bitline 360. Therefore, bitlines 360 are formed, each including the conductive material 362 formed in the bitline pattern 355 and the stud type capping layer 369 formed on the conductive material 362 and the second inter-insulation layer 340.

Of the capping layer 369, the spacer-shaped second capping material 367 is formed to partially surround only a sidewall portion of the pillar-shaped first capping material 365, thus the conductive material 362 is surrounded by the second inter-insulation layer 340 of an oxide film series.

On this occasion, only half the thickness of the second capping material 365 is surrounded by the second inter-insulation 340, so that it can obtain process margins as well as maintain insulating properties and reduce parasitic capacitance between bitlines 360 and between a bitline 360 and a storage node contact hole in a subsequent process.

Figure 6H:
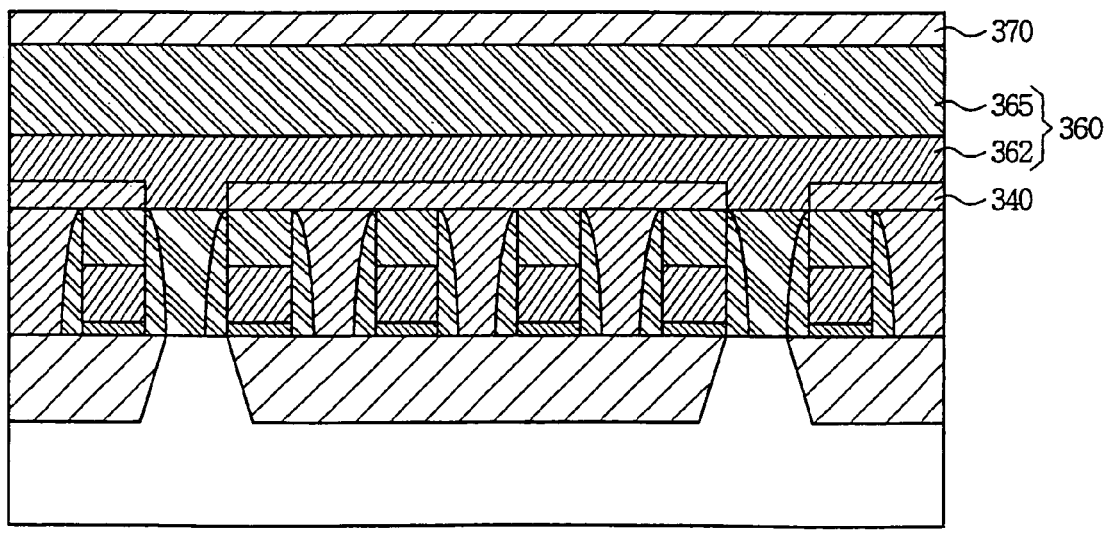
Figure 7H:
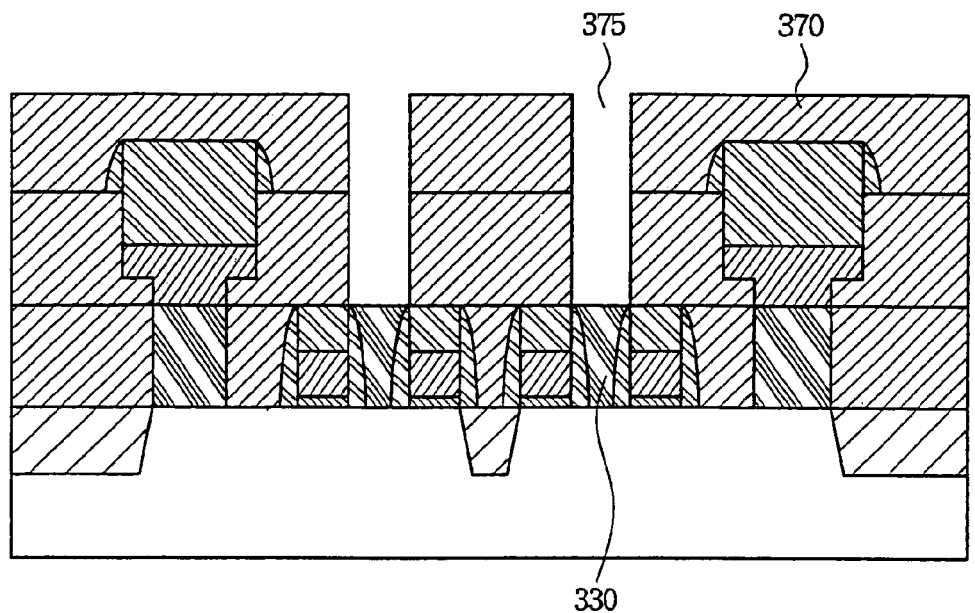

Referring to FIG. 5H, FIG. 6H, and FIG. 7H, a third inter-insulation layer 370 of an oxide film series is deposited on the entire surface of the substrate and the second and the third inter-insulation layers 340 and 370 are etched to form storage node contact holes 375. The storage node contact holes 375 expose corresponding contact pads of the contact pads 330 that are connected with storage nodes to be formed in a subsequent process. The second and the third inter-insulation layers 340 and 370 are self align-etched with the spacer 367 of the bitline capping layer 369 serving as an etching stop layer, thereby forming the self-aligned storage node contact contact holes 375.

Figure 6I:
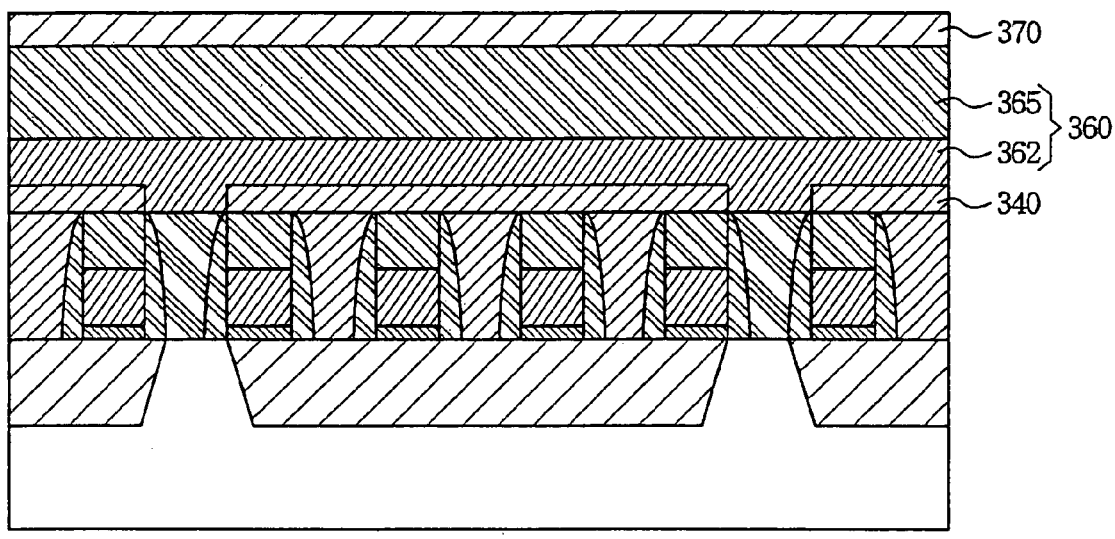
Figure 7I:
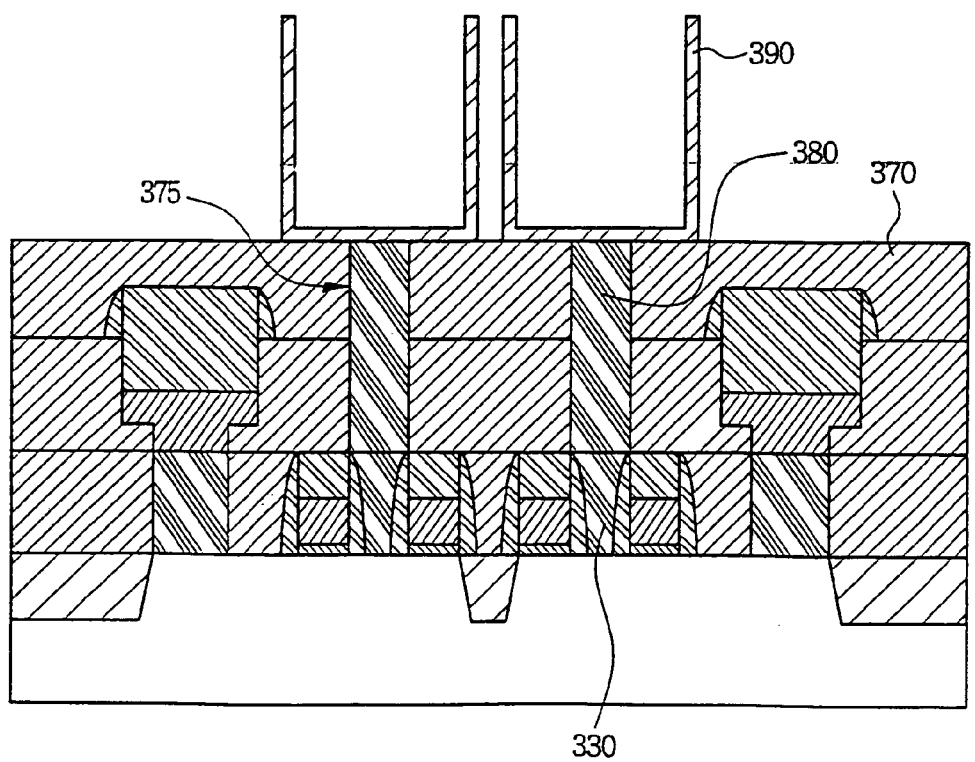

Referring to FIG. 5I, FIG. 6I, FIG. 7I, a conductive material such as a poly-silicon film is deposited on the third inter-insulation layer 370 including the storage node contact hole 375 and is smoothed through a CMP or an etch back process, thereby forming storage node contact plugs 380. Subsequently, storage nodes 390 for capacitors electrically connected with the storage node contact plugs 380 are formed.

As shown above, with a method of fabricating a semiconductor device in accordance with an embodiment of the invention, the storage node contact hole 375 is self align-etched and sufficient etching process margin is ensured. By forming a stud-shaped bitline capping layer, the capping layer serves as an etching stop layer during an etching process for forming the storage node contact hole. In addition, the second and the third inter-insulation layers 340 and 370 with an oxide film series having a lower dielectric constant than a silicon nitride film exist between adjacent bitlines 360 and between the bitline 360 and the storage node contact plug 380, reducing the parasitic capacitance between them.

Figure 11A:
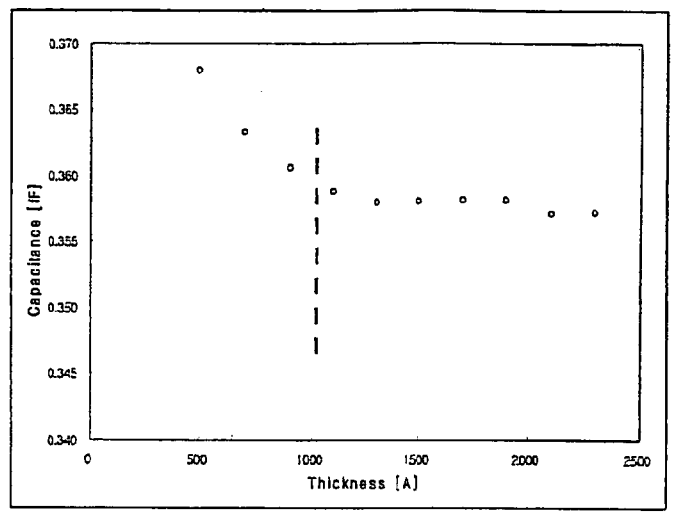
FIG. 11A is a diagram showing the relationship between the thickness of a bitline capping layer and the parasitic capacitance.
Figure 11B:
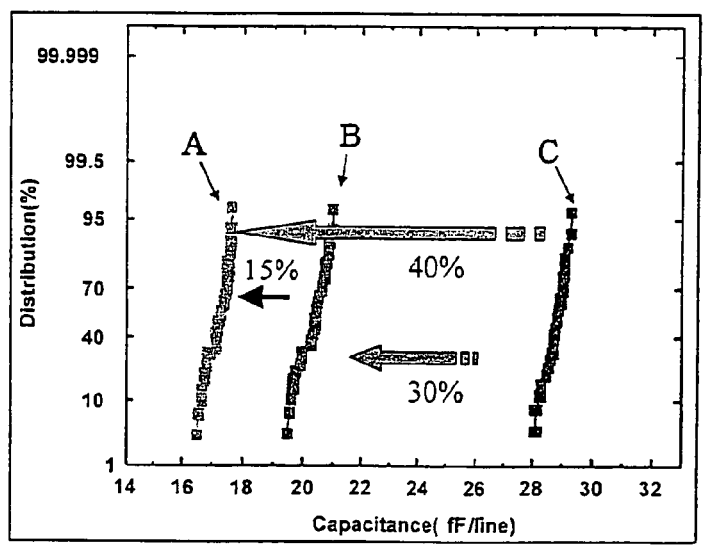
FIG. 11B is a diagram showing the relationship between a bitline spacer and parasitic capacitance.

FIG. 11A is a diagram illustrating the relationship between the thickness of a bitline capping layer and the parasitic capacitance. It is found that a reduced threshold value of the parasitic capacitance occurs when the thickness of the silicon nitride bitline capping layer is about 1000 Å. FIG. 11B is a diagram illustrating the relationship between the compositions of a bitline spacer and the parasitic capacitance. 'A' shows the distribution of the parasitic capacitance in the case where the bitline spacer is fully composed of an oxide film, while 'C' shows the distribution of the parasitic capacitance in the case where the bitline spacer is fully composed of a silicon nitride film. 'B' shows the distribution of the parasitic capacitance in the case where the bitline spacer is partially comprised of an oxide film, that is, in the case where an oxide film exists between the bitlines and a silicon nitride film exists between the bitline and the storage node contact hole. Referring to FIG.11B, it is found that the parasitic capacitance is reduced by 30% and 40%, respectively, in case A and case B as compared to the case C where the bitline spacer is fully composed of a silicon nitride film.

Seeing FIG. 11A and FIG. 11B, the invention can minimize the parasitic capacitance as well as maintain insulating properties and also improve process margins for forming a storage node contact hole by forming a stud-shaped bitline capping layer.

FIGS. 8A-8D, FIGS. 9A-9D, and FIGS. 10A-10D are cross-sectional diagrams illustrating another embodiment of the present invention. FIGS. 8A-8D are cross-sectional diagrams corresponding to a line IA-IA' of FIG. 1. FIGS. 9A-9D are cross-sectional diagrams corresponding to a line IB-IB' of FIG. 1. FIGS. 10A-10D are cross-sectional diagrams corresponding to a line IC-IC' of FIG. 1.

A method of fabricating a semiconductor device in accordance with another embodiment of the invention is the same in some respects as the method of the previous embodiment. However, it is different in terms of forming a second inter-insulation layer with a stack structure where an upper oxide film, a lower oxide film, and a silicon nitride film for an etching stop layer are sandwiched between the upper oxide film and the lower oxide film. This is done in order to obtain etching stability in an etching process for forming the capping spacer.

Figure 8A:
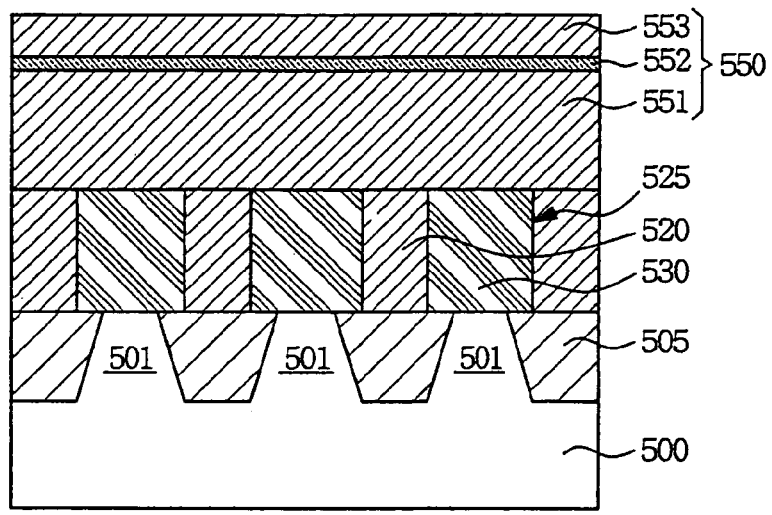
FIG. 8A-8D are process cross-sectional diagrams illustrating a fabrication method of a semiconductor device in accordance with another embodiment of the invention.
Figure 9A:
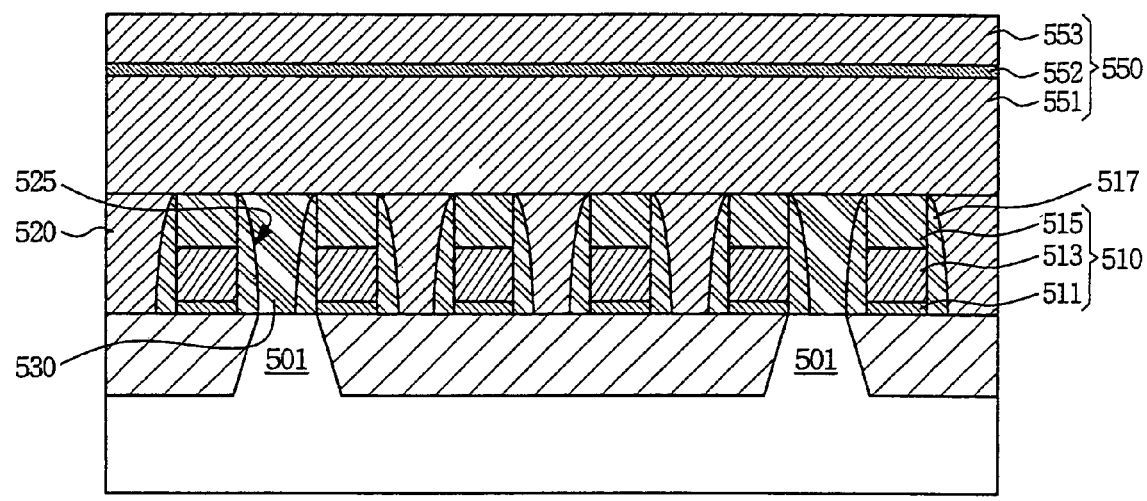
FIG. 9A-9D are process cross-sectional diagrams illustrating a fabrication method of a semiconductor device in accordance with another embodiment of the invention.
Figure 10A:
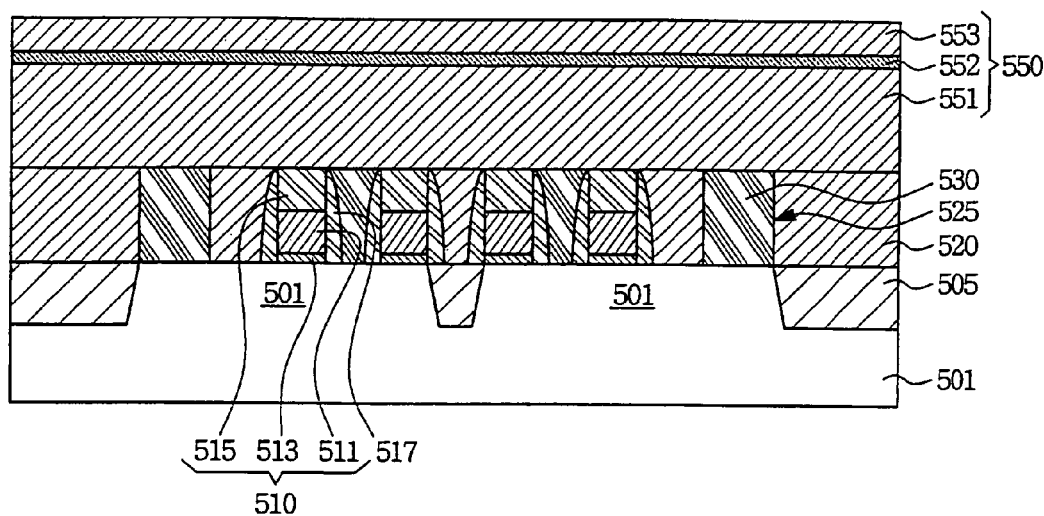
FIG. 10A-10D are process cross-sectional diagrams illustrating a fabrication method of a semiconductor device in accordance with another embodiment of the invention.

Referring to FIG. 8A, FIG. 9A and FIG. 10A, a semiconductor substrate 500 having active regions 501 and field regions is provided. STI device isolation films 505 are formed in the field regions of the semiconductor substrate 500 through a conventional STI (Shallow Trench Isolation) process.

Gates 510 having a stack structure with a gate insulating film 511, a gate electrode material 513, and a capping layer 515 are formed on the semiconductor substrate 500, and a gate spacer 517 is formed on a sidewall of the gate 510.

After depositing a first inter-insulation layer 520 on the entire surface of the substrate including the gates 510, contacts 525 exposing portions of the active region 501 between the gates 510 are formed, and contact pads 530 including a poly-silicon film are formed in the contacts 525. At this moment, though not shown in the drawings, the contact pads 530 are connected to impurity regions having a predetermined conductivity type formed in the active region 501 through the contacts 525.

Then, a second inter-insulation layer 550 is deposited on the first inter-insulation layer 520 in a stack structure including a lower oxide film 551, a silicon nitride film 552, and an upper oxide film 553. The upper oxide film 553 is removed while forming a capping spacer in a subsequent process, and the silicon nitride film 552 serves as an etching stop film when etching the upper oxide film 553.

Figure 8B:
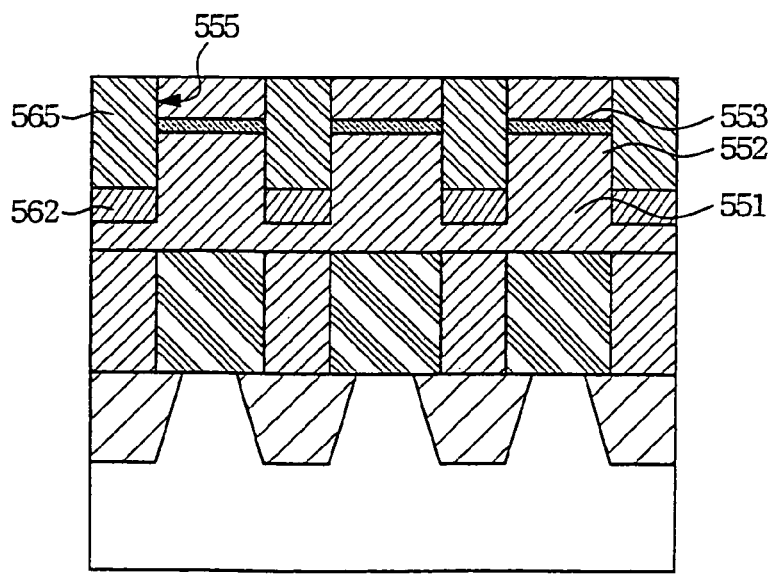
Figure 9B:
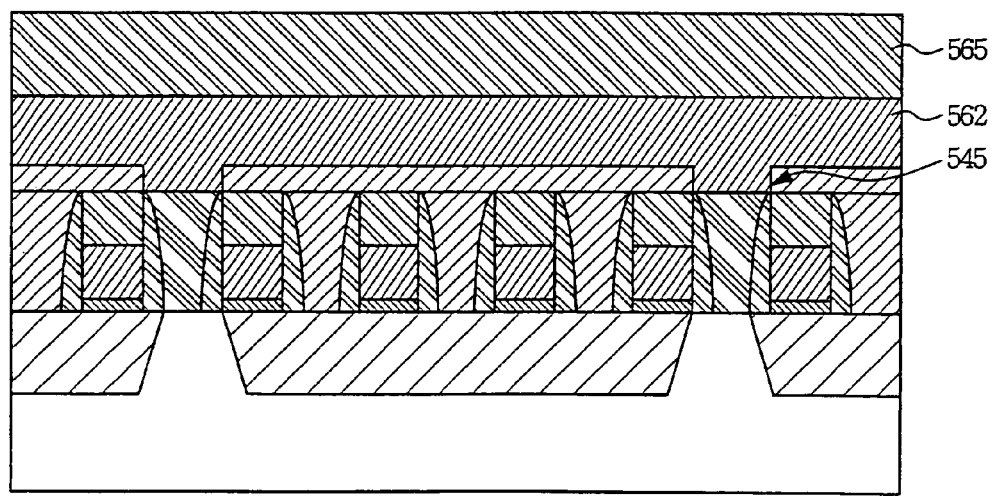
Figure 10B:
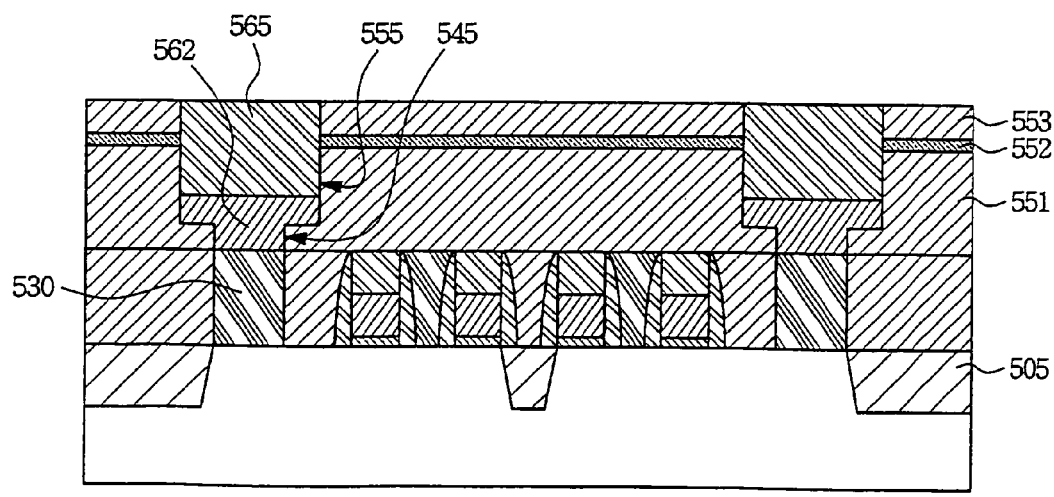

Referring to FIG. 8B, FIG. 9B, and FIG. 10B, bitline contact holes 545 and bitline patterns 555 having a grooved shape are formed by etching the second inter-insulation layer 550 through a dual damascene process. At this moment, when etching the second inter-insulation layer 550, it should be etched without any etching selectivity between the upper and lower oxide films 551 and 553 and a silicon nitride film 552.

While forming the bitline contact hole 545 and the bitline pattern 555 through the dual damascene process, it is possible to form the bitline pattern 555 after forming the bitline contact hole 545, or to form the bitline contact hole 545 after forming the bitline pattern 555. On this occasion, when forming the bitline contact hole 545, the contact pad 530 serves as an etching stop film.

Then, after depositing a conductive material for a bitline, for instance, a tungsten film, on the second inter-insulation layer 550 including the bitline contact 545 and the bitline pattern 555 having a grooved shape, the conductive material 562 for a bitline is filled with portions of the grooved-shaped bitline pattern 555 by an over CMP process or an over etch back process. At this point, the conductive material 562 for a bitline should be filled in a lower part than the silicon nitride film 552 within the bitline pattern 555. That is, the thickness of the conductive material 562 for a bitline should be thinner than that of the lower oxide film 551.

Next, after depositing a first capping material for a bitline, for example, a silicon nitride film, on the second inter-insulation layer 550 including the bitline pattern 555, the film is etched by a CMP process or an etch back process, thereby filling in the bitline pattern 555 with the silicon nitride film 565 on the conductive material 562 to form a bitline.

Figure 8C:
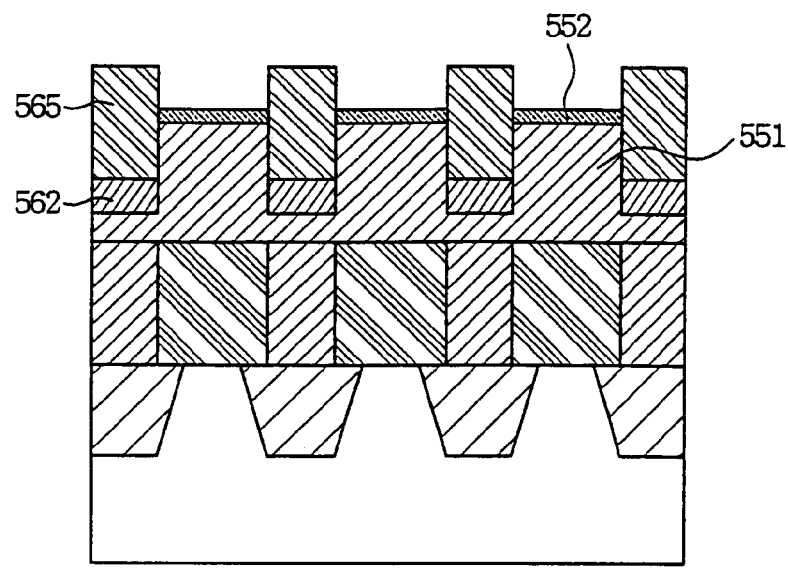
Figure 9C:
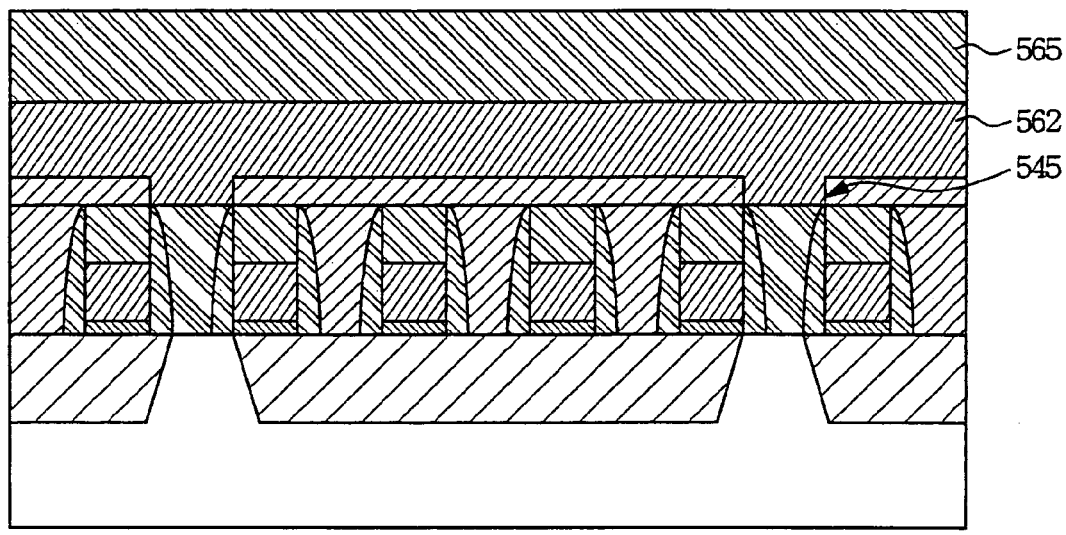
Figure 10C:
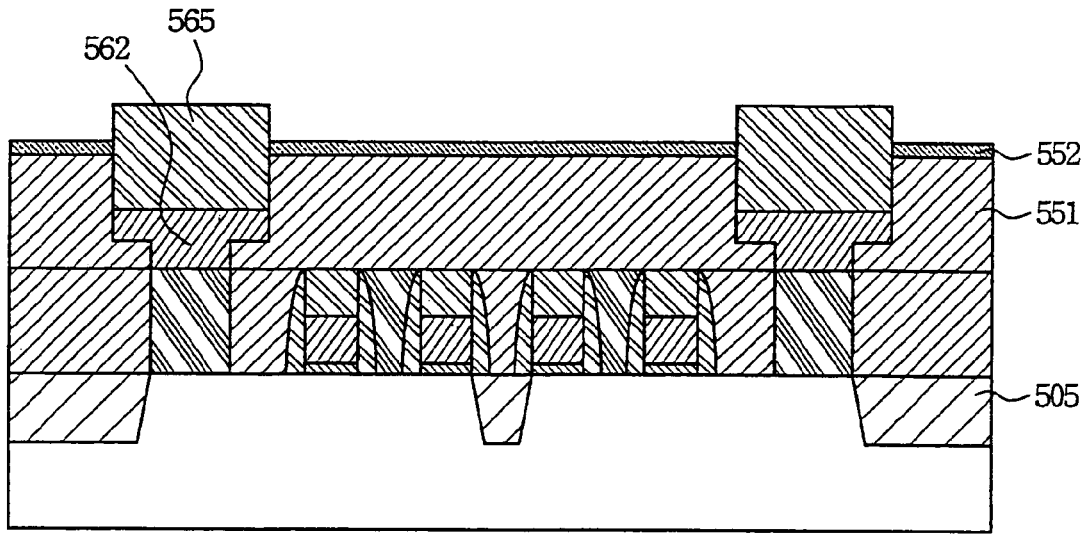

Referring to FIG. 8C, FIG. 9C, and FIG. 10C, the upper oxide film 553 of the second inter-insulation layer 550 is dry or wet etched. It is possible to stably remove the upper oxide film 553 by using the silicon nitride film 552 as an etching stop film.

Figure 8D:
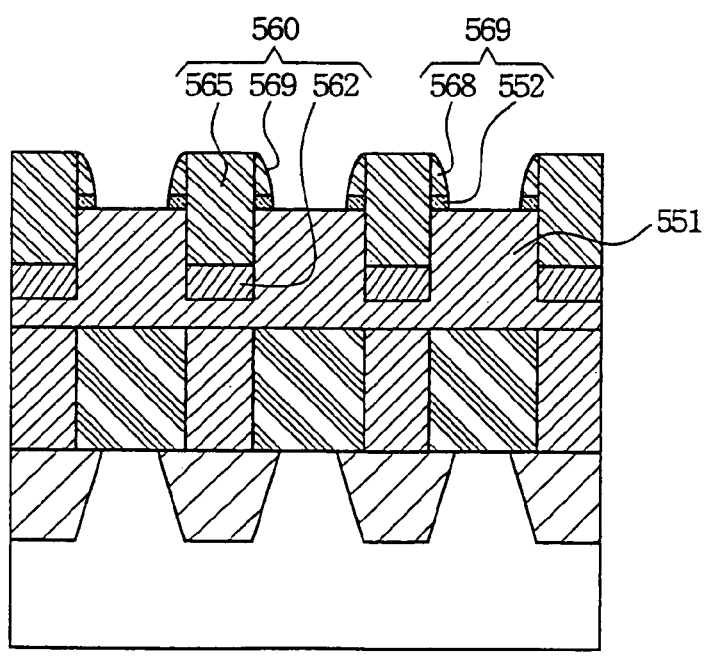
Figure 9D:
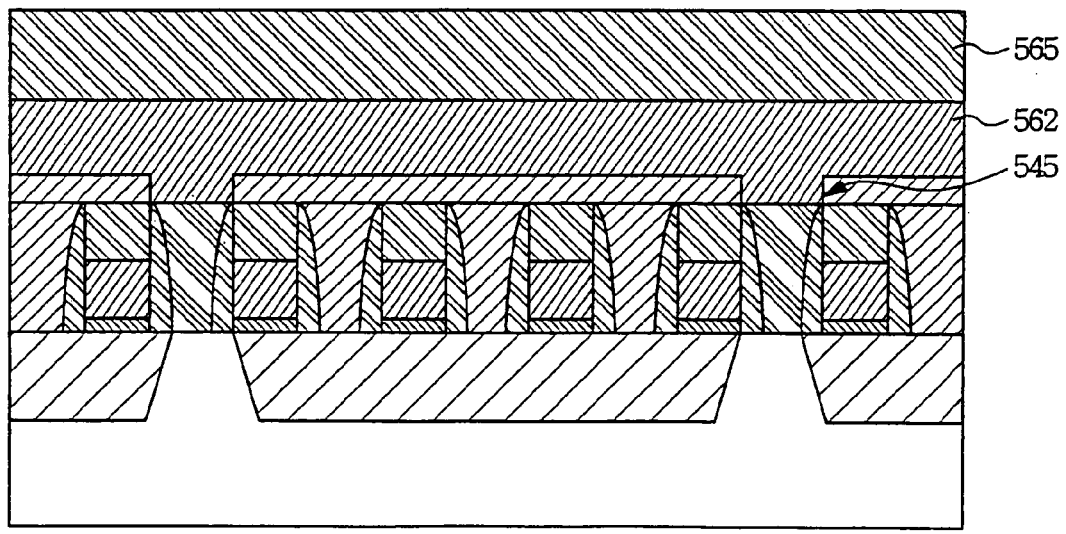
Figure 10D:
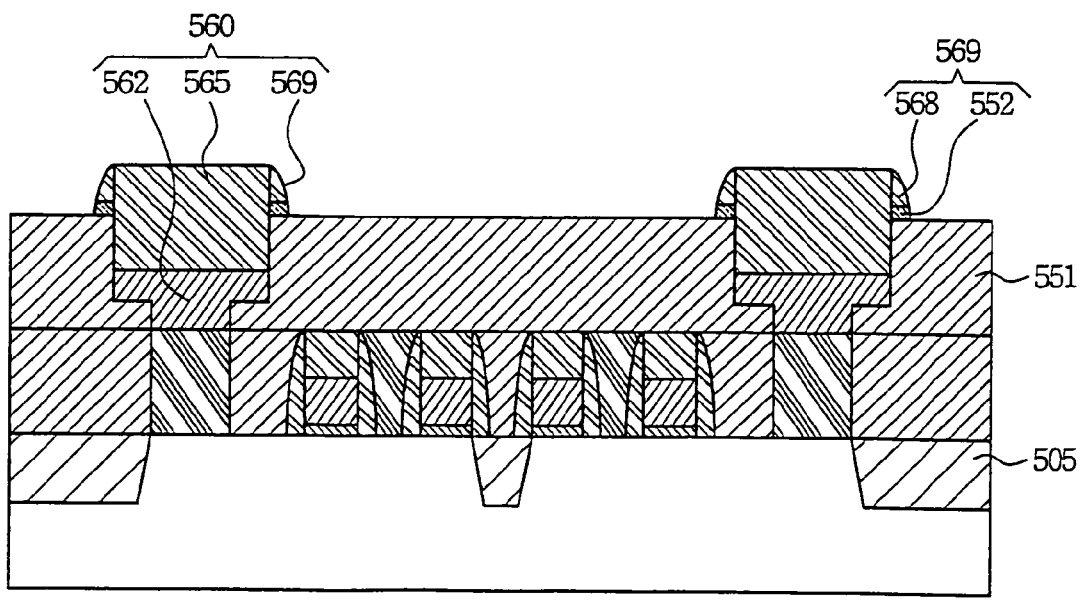

Referring to FIG. 8D, FIG. 9D, and FIG. 10D, after depositing a material having dry and wet etching selectivity with respect to the lower oxide film 551, for instance, a silicon nitride film on the entire surface of a substrate as a second capping material for a bitline, a spacer 569 is formed on a sidewall of the silicon nitride film 565 by etching the silicon nitride film. At this time, when etching the silicon nitride film, the silicon nitride film 552 is also etched to remain under the silicon nitride film 568, thereby exposing the lower oxide film 551.

Therefore, a bitline capping layer 569 is formed, including the pillar-type first capping material 565 formed on the conductive material 562 for a bitline and the second capping material 567 and the nitride film 552 forming a spacer on the sidewall of the first capping material 565. So, bitlines 560 are formed, having a conductive material 562 formed within the bitline pattern 555 and the stud type capping layer 569 formed on the conductive material 562 and the second inter-insulation layer 540.

At this time, the second capping material 568 of the spacer surrounds about half the thickness of a sidewall portion of the first capping material 565 of the pillar type, so as to reduce parasitic capacitance as well as to obtain insulating properties and improve process margins.

Though not shown in the drawings, after depositing a third inter-insulation layer, storage node contact holes are formed by etching the third inter-insulation layer and the lower oxide film 551, and storage contact plugs are formed in the storage node contacts, and then storage nodes of capacitors electrically connected with the contact plugs are formed.

In this embodiment of the invention, although the bitlines are formed by depositing the conductive material for the bitline only, it is possible to form the bitline by depositing the conductive material for a bitline after depositing a barrier metal film like TiN.

According to the embodiments of the invention described above, sufficient process margins can be obtained while forming a storage node contact hole by forming stud-type bitline capping layers, as well as reducing contact resistance by increasing the contact open regions. In addition, embodiments of the invention may decrease parasitic capacitance, since an oxide film having a lower dielectric constant than a silicon nitride film exists between adjacent bitlines and between a bitline and a storage node contact hole.

Embodiments of the invention will now be described in a non-limiting way.

An embodiment of the invention provides a semiconductor device that includes an insulating film formed on a semiconductor substrate and having a bitline contact hole and a groove-shaped bitline pattern, a bitline formed on the bitline contact hole and in a portion of the bitline pattern and surrounded by the insulating film, and a bitline capping layer formed on the bitline within the bitline pattern and the insulating film. The bitline capping layer protrudes from the insulating film, and the protruded portion of the bitline capping layer is wider than a width of the bitline.

The bitline capping layer includes a first capping material formed on the bitline and within the bitline pattern with a pillar shape that protrudes from the insulating film, and a second capping material for a sidewall spacer formed on the protruded portion of the first capping material. Preferably, the protruded portion of the first capping material of the bitline capping layer is approximately half the thickness of the first capping material.

In addition, an embodiment of the invention provides a method of fabricating a semiconductor device that includes the processes of forming an insulating film on a semiconductor substrate, etching the insulating film to form a bitline contact hole and a groove-shaped bitline pattern, forming a bitline on the bitline contact hole and a portion of the bitline pattern, and forming a bitline capping layer on the bitline within the bitline pattern and on the insulating film that protrudes from the insulating film. The protruded portion of the bitline capping layer is wider than a width of the bitline.

Forming the bitline capping layer includes the processes of depositing a first capping material on an entire surface of the substrate, etching the first capping material to fill within the bitline pattern on the bitline, etching the insulating film to a predetermined thickness, thereby protruding a portion of the first capping material, depositing a second capping material on an entire surface of the substrate, etching the second capping material to remain only on a sidewall of the protruded portion of the first capping material.

The bitline capping layer may also include a pillar type first capping material formed on the bitline within the bitline pattern and protruding from the insulating film, and a second capping material forming a sidewall spacer on the protruded portion of the first capping material on the insulating film, wherein the bitline capping layer has a stud type structure.

The insulating layer includes an upper oxide film, a lower oxide film, and a silicon nitride film between the upper and the lower oxide films. The upper oxide film is etched using the silicon nitride film as an etching stop film to protrude the portion of the first capping layer. While etching the second capping material, the lower oxide film is etched to remain under the second capping material.

Furthermore, embodiments of the invention provide a method of fabricating a semiconductor device that include the processes of forming a first insulating film having a bitline contact pad and a storage node contact pad on a semiconductor substrate, forming a second insulating film on an entire surface of the substrate, etching the second insulating film to form a bitline contact exposing the bitline contact pad and a groove-shaped bitline pattern, forming a bitline in a portion of the bitline pattern that will be connected with the bitline contact pad through the bitline contact hole, forming a bitline capping layer on the bitline within the bitline pattern and the insulating film that protrudes from the second insulating film so that the protruded portion is wider than a width of the bitline pattern, forming a third insulating film on an entire surface of the substrate, and etching the second and the third insulating films to form a storage node contact hole that exposes the storage node contact pad.

The bitline contact hole and the bitline pattern are formed by using a dual damascene process, and after forming the bitline contact hole by etching the second insulating film using the bitline contact pad as an etching stop film, the bitline pattern is formed by etching the second insulating film. Alternatively, after forming the bitline pattern by etching the second insulating film, the bitline contact hole is formed by etching the second insulating film using the bitline contact pad as an etching stop film.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

We claim:

1. A semiconductor device comprising:
    an insulating film formed on a semiconductor substrate having a bitline contact hole and a groove-shaped bitline pattern;
    a bitline that is surrounded by the insulating film and formed adjacent the bitline contact hole and in a portion of the bitline pattern; and
    a bitline capping layer formed on the bitline, a first portion of the bitline capping layer formed within the bitline pattern and a second portion of the bitline capping layer protruding from the insulating film, the protruded portion of the bitline capping layer being wider than a width of the bitline.

2. The semiconductor device of claim 1, the bitline capping layer comprising:
    a pillar-type first capping material formed on the bitline that protrudes from the insulating film; and
    a sidewall spacer type second capping material formed adjacent a protruded portion of the first capping material on the insulating film.

3. The semiconductor device of claim 2, wherein the protruded portion of the first capping material is approximately half the thickness of the first capping material.

4. The semiconductor device of claim 1, wherein the bitline capping layer has a stud type structure and comprises a material having a wet and a dry etching selectivity with respect to the insulating film.

5. The semiconductor device of claim 4, wherein the material comprises a film from a silicon nitride film series, and the insulating film comprises a film from an oxide film series.

6. A semiconductor device comprising:
    an insulating film formed on a semiconductor substrate having a groove-shaped bitline pattern;
    a bitline formed in the insulating film that fills less than an entire portion of the bitline pattern; and
    a bitline capping layer formed on the bitline, the bitline capping layer formed partially inside the bitline pattern of the insulating film and partially outside of the insulating film.

7. The semiconductor device of claim 6, wherein the bitline capping layer includes:
    a pillar-type first capping material formed partially inside the bitline pattern and partially outside the insulating film; and
    a sidewall spacer type second capping material formed on the portion of the first capping material that is outside the insulating film.

* * * * *